(12) United States Patent
Fadhel et al.

(10) Patent No.: US 9,040,175 B2
(45) Date of Patent: May 26, 2015

(54) ELECTRONIC DEVICE COMPRISING AN ORGANIC SEMICONDUCTING MATERIAL

(75) Inventors: Omrane Fadhel, Dresden (DE); Ramona Pretsch, Dresden (DE)

(73) Assignee: NOVALED AG, Dresden (DE)

( * ) Notice: Subject to any disclaimer, the term of this patent is extended or adjusted under 35 U.S.C. 154(b) by 324 days.

(21) Appl. No.: 13/699,532

(22) PCT Filed: Jun. 8, 2011

(86) PCT No.: PCT/EP2011/002807
§ 371 (c)(1),
(2), (4) Date: Feb. 1, 2013

(87) PCT Pub. No.: WO2011/154131
PCT Pub. Date: Dec. 15, 2011

(65) Prior Publication Data
US 2013/0200341 A1    Aug. 8, 2013

(30) Foreign Application Priority Data

Jun. 10, 2010 (EP) .................................. 10165537

(51) Int. Cl.
*H01L 51/50* (2006.01)
*H01L 51/00* (2006.01)

(52) U.S. Cl.
CPC ......... *H01L 51/0072* (2013.01); *H01L 51/5048* (2013.01); *H01L 51/5052* (2013.01);
(Continued)

(58) Field of Classification Search
None
See application file for complete search history.

(56) References Cited

U.S. PATENT DOCUMENTS

| 4,356,429 A | 10/1982 | Tang |
| 5,093,698 A | 3/1992 | Egusa |

(Continued)

FOREIGN PATENT DOCUMENTS

| EP | 1 804 309 A1 | 7/2007 |
| EP | 2 072 517 A1 | 6/2009 |
| WO | 2009/021107 A1 | 2/2009 |

OTHER PUBLICATIONS

Zimmerman et al., Rigid Molecular Tweezers: PreOrganized Hosts for Electron Donor-Acceptor Complexation in Organic Solvents, J. Am Chem Soc., 1989, vol. 111, pp. 1373-1381.*

(Continued)

*Primary Examiner* — Gregory Clark
(74) *Attorney, Agent, or Firm* — Sutherland Asbill & Brennan LLP

(57) ABSTRACT

The present invention relates to an electronic device comprising at least one organic semiconducting material according to the following formula (I): wherein $R_{1-4}$ are independently selected from H, halogen, CN, substituted or unsubstituted $C_1$-$C_{20}$-alkyl or heteroalkyl, $C_6$-$C_{20}$-aryl or $C_5$-$C_{20}$-heteroaryl, $C_1$-$C_{20}$-alkoxy or $C_6$-$C_{20}$-aryloxy, Ar is selected from substituted or unsubstituted $C_6$-$C_{20}$-aryl or $C_5$-$C_{20}$-heteroaryl, and R5 is selected from substituted or unsubstituted $C_6$-$C_{20}$-aryl or $C_5$-$C_{20}$-heteroaryl, H, F or formula (II).

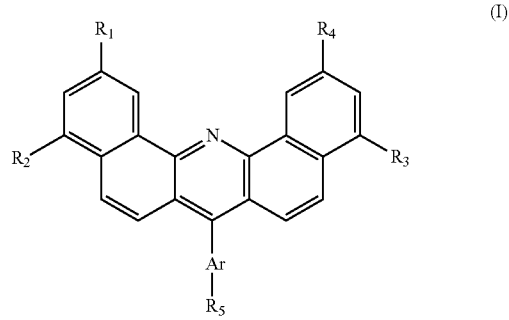

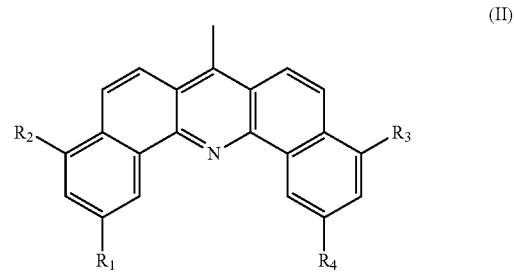

9 Claims, 1 Drawing Sheet

(52) U.S. Cl.
CPC ........ *H01L51/0054* (2013.01); *H01L 51/0069* (2013.01); *H01L 51/5028* (2013.01); *Y10S 428/917* (2013.01)

(56) References Cited

U.S. PATENT DOCUMENTS

| | | | |
|---|---|---|---|
| 7,026,643 | B2 | 4/2006 | Dimitrakopoulos et al. |
| 7,858,967 | B2 | 12/2010 | Pfeiffer et al. |
| 7,986,090 | B2 | 7/2011 | Pfeiffer et al. |
| 8,309,284 | B2 | 11/2012 | Kanitz et al. |
| 8,329,898 | B2 | 12/2012 | Salbeck et al. |
| 8,344,848 | B2 | 1/2013 | Moschl et al. |
| 2004/0104394 | A1 | 6/2004 | Lin et al. |
| 2005/0146262 | A1 | 7/2005 | Yamauchi et al. |
| 2006/0033115 | A1 | 2/2006 | Blochwitz et al. |
| 2006/0244370 | A1 | 11/2006 | Tyan et al. |
| 2007/0252140 | A1 | 11/2007 | Limmert et al. |
| 2008/0182129 | A1 | 7/2008 | Klubek et al. |
| 2008/0203406 | A1 | 8/2008 | He et al. |
| 2008/0227979 | A1 | 9/2008 | Saalbeck et al. |
| 2008/0230776 | A1 | 9/2008 | Li et al. |
| 2009/0212280 | A1 | 8/2009 | Werner et al. |
| 2011/0108772 | A1 | 5/2011 | Zeika et al. |

OTHER PUBLICATIONS

Bosnich et.al., Supramolecular Chemistry: Moleclar Recognintion and Self-Assembly Using Rigid Spacer-Chelators Bearing Cofacial Terpyridyl Palladium(II) Complexex Separated by 7 ang., J. Am. Chem. Soc., 2001, vol. 123, pp. 3940-3952.*

Bard et al., "Electrochemical Methods: Fundamentals and Applications," Wiley, 2nd Edition, 2000, pp. 1-28 and pp. 239-247.

Bloom et al., "Tervalent Conducting Polymers with Tailor-Made Work Functions: Preparation, Characterization, and Application in Cathodes in Electroluminescent Devices," J. Am. Chem. Soc., 2001, 123:9436-9442.

Connelly et al., "Chemical Redox Agents for Organometallic Chemistry," Chem. Rev., 1996, 96:877-910.

D'Andrade et al., "Relationship Between the Ionization and Oxidation Potentials of Molecular Organic Semiconductors," Organic Electronics, 2005, 6:11-20.

Kim et al., "Self-Assembly of Rectangles via Building Units Bearing Salen and Oxazoline Ligands," Journal of Organometallic Chemistry, 2006, 291:5946-5954.

Koepp et al., "Der Vergleich der Spannungsreihen in Verschiedenen Solventien. II," Bd., 1960, 64(4):483-491.

Pommerehne et al., "Efficient Two Layer LEDs on a Polymer Blend Basis," Adv Mater., 1995, 7(6):551-554.

Trassati, "The Absolute Electrode Potential: An Explanatory Note," Pure & Appl. Chem., 1986, 58(7):955-966.

PCT International Search Report for PCT Application No. PCT/EP2011/002807 mailed Jul. 19, 2011.

PCT International Preliminary Report on Patentability mailed Dec. 10, 2012 for PCT Application No. I PCT/EP2011/002807.

Office Action and Search Report for Chinese Application No. 201180028541.X mailed Jan. 13, 2015.

* cited by examiner

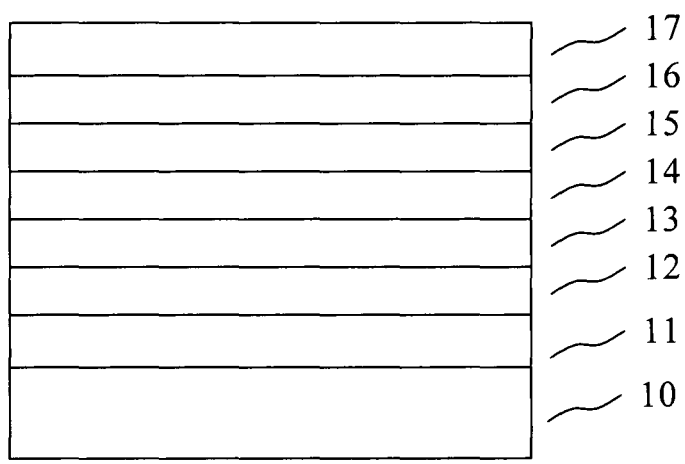

ELECTRONIC DEVICE COMPRISING AN ORGANIC SEMICONDUCTING MATERIAL

The present invention relates to an organic semiconducting layer, preferably an electronic device, comprising at least one organic semiconducting material.

FIELD OF THE INVENTION

Conjugated organic compounds have different applications. One important field comprises organic semiconductors. Organic semiconductors can be used to fabricate simple electronic components e.g. resistors, diodes, field effect transistors, and also optoelectronic components like organic light emitting devices (e.g. OLED), and many others. The industrial and economical significance of the organic semiconductors and their devices is reflected in the increased number of devices using organic semiconducting active layers and the increasing industry focus on the subject.

A simple OLED is demonstrated in U.S. Pat. No. 4,356,429A. There, between conductive electrodes, two semiconductive organic layers are brought together: one transporting holes and the other one transporting electrons. The recombination of holes and electrons forms excitons in one or both of the organic layers, the excitons are eventually emitted following the spin statistics. Excitons with triplet spin can also be harvested by using the materials and techniques described in EP1705727. More elaborated OLEDs are described in EP1804309 and US2008182129.

Conjugated organic compounds can be small molecules, for instance monomers, or oligomers, polymers, copolymers, copolymers of conjugated and non-conjugated blocks, completely or partially cross-linked layers, aggregate structures, or brush like structures. A device made with different types of compounds, in different layers or mixed together, for example with polymer and small molecule layers, is also called a polymer—small molecule hybrid device. Organic electronic semiconductors can also be used in organic electronic devices, and in organic-inorganic hybrid devices.

Despite the large electronic gap, usually up to 3 eV, formed between the highest occupied molecular orbital (HOMO) and the lowest unoccupied molecular orbital (LUMO) of the molecule, it is normally still low enough such that both positive and negative charge carriers can be injected by special electrodes. Typical organic semiconducting compounds may have a gap that is still high enough so that the compounds are optically active.

Organic field effect transistors are explained, for example, in U.S. Pat. No. 7,026,643, US2005146262 and US2008230776. The resistance of a semiconductive layer that is contacted by two electrodes (source and drain) can be controlled by the voltage that is applied to the gate. The gate is displaced on an insulator that is displaced parallel in contact to the semiconductive layer. Various geometries can be used, such as bottom gate (on the substrate), top gate (on the opposite side of the semiconductive layer relative to the substrate) or on both sides. Many different arrangements of layers can be used such as bipolar layers, injection layer, insulating layer between electrode and semiconductive layer to lower the off current, etc.

BACKGROUND OF THE INVENTION

Different functional layers in different organic semiconductor devices request a variety of special characteristics.

For instance organic thin-film transistors (OTFTs) need high mobility materials in their active channel. Transparent circuits, such as transparent OTFTs require that the high mobility organic material also comprises a wide electronic band gap; the electric injection of holes and/or electrons must be still provided.

OLEDs require transparent transport layers, with high conductivity. The transparency is necessary in those opto-electric devices to avoid non desired absorption of the light. These so called "window" materials can be used as transport layers, exciton or charge blocking layers. The thickness of the layers made with the window materials is used to adjust the micro cavity of the OLEDs in such a way that the outcoupled emission of the OLED is a maximum. The non-optically active layers of all kinds of semiconductor devices can be exchanged for window materials in order to fabricate fully transparent components and circuits (e.g US20060033115). The functionality and nomenclature of the layers are typical as used in the field. Further explanation can be found in US2006244370.

Electronic devices also need high stability towards temperature, meaning that the intrinsic properties of the amorphous organic semiconducting materials, such as triphenyl amine derivatives, or phenantronine derivatives, must include a high glass transition temperature (Tg) and high temperature stability in the device.

The performance characteristics of (opto)electronic multilayered components are determined by the ability of the layers to transport the charge carriers, amongst others. In the case of light-emitting diodes, the ohmic losses in the charge transport layers during operation are associated with their conductivity. The conductivity directly influences the operating voltage required and also determines the thermal load of the component. Furthermore, depending on the charge carrier concentration in the organic layers, a bending of the band in the vicinity of a metal contact results which simplifies the injection of charge carriers and can therefore reduce the contact resistance.

By electrically doping hole transport layers with a suitable acceptor material (p-doping) or electron transport layers with a donor material (n-doping), respectively, the density of charge carriers in organic solids (and therefore the conductivity) can be increased substantially. Additionally, analogous to the experience with inorganic semiconductors, applications can be anticipated which are precisely based on the use of p- and n-doped layers in a component and otherwise would be not conceivable. The use of doped charge-carrier transport layers (p-doping of the hole transport layer by admixture of acceptor-like molecules, n-doping of the electron transport layer by admixture of donor-like molecules) in organic light-emitting diodes is described in US2008203406 and U.S. Pat. No. 5,093,698.

US2008227979 discloses in detail the doping of organic transport materials, also called matrix, with inorganic and with organic dopants. Basically, an effective electronic transfer occurs from the dopant to the matrix increasing the Fermi level of the matrix. For an efficient transfer in a p-doping case, the LUMO energy level of the dopant must be more negative than the HOMO energy level of the matrix or at least slightly more positive, not more than 0.5 eV, to the HOMO energy level of the matrix. For the n-doping case, the HOMO energy level of the dopant must be more positive than the LUMO energy level of the matrix or at least slightly more negative, not lower than 0.5 eV, to the LUMO energy level of the matrix. It is furthermore desired that the energy level difference for energy transfer from dopant to matrix is smaller than +0.3 eV.

Typical examples of doped hole transport materials are: copperphthalocyanine (CuPc), which HOMO level is approximately −5.2 eV, doped with tetrafluoro-tetracyano-quinonedimethane (F4TCNQ), which LUMO level is about −5.2 eV; zincphthalocyanine (ZnPc) (HOMO=−5.2 eV) doped with F4TCNQ; a-NPD (N,N'-Bis(naphthalen-1-yl)-N, N-bis(phenyl)-benzidine) doped with F4TCNQ.

Typical examples of doped electron transport materials are: fullerene C60 doped with acridine orange base (AOB); perylene-3,4,9,10-tetracarboxylic-3,4,9,10-dianhydride (PTCDA) doped with leuco crystal violet; 2,9-di(phenan-thren-9-yl)-4,7-diphenyl-1,10-phenanthroline doped with tetrakis(1,3,4,6,7,8-hexahydro-2H-pyrimido[1,2-a]pyrim-idinato)ditungsten (II) (W(hpp)$_4$); naphthalene tetracarboxy-lic acid di-anhydride (NTCDA) doped with 3,6-bis-(dimethyl amino)-acridine; NTCDA doped with bis(ethylene-dithio) tetrathiafulvalene (BEDT-TTF).

There is a technical challenge to provide electron transport materials (ETM) and emitter host (EMH) materials that have a sufficiently low laying LUMO level so that they can be doped, and still have a high enough laying LUMO level which can efficiently transfer charge to emitter host (in case of an ETM) and transfer energy to the emitter dopant (in case of EMH). The limitation for high laying LUMO level of the ETL is given by the dopability, since the n-dopants with very high HOMO tend to be unstable; also the injection is difficult for very high LUMO of the ETL.

SUMMARY OF THE INVENTION

It is an object of the present invention to provide a semi-conducting layer, preferably an electronic device, comprising a specific class of functional materials which can be utilized as organic semiconducting materials to overcome the drawbacks of the prior art. Especially, an electronic device shall be provided comprising transparent organic semiconducting materials which are additionally thermally stable and/or dopable. Further, the electronic device shall comprise semiconducting materials which can be synthesized without any difficulties.

This object is achieved by a compound according to formula (I) and an electronic device comprising at least one organic semiconducting material according to the following formula (I):

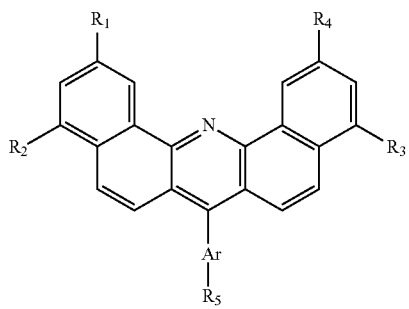

(I)

wherein $R_{1-4}$ are independently selected from H, halogen, CN, substituted or unsubstituted $C_1$-$C_{20}$-alkyl or heteroalkyl, $C_6$-$C_{20}$-aryl or $C_5$-$C_{20}$-heteroaryl, $C_1$-$C_{20}$-alkoxy or $C_6$-$C_{20}$-aryloxy, Ar is selected from substituted or unsubstituted $C_6$-$C_{20}$-aryl or $C_5$-$C_{20}$-heteroaryl, and R5 is selected from substituted or unsubstituted $C_6$-$C_{20}$-aryl or $C_5$-$C_{20}$-heteroaryl, H, F or

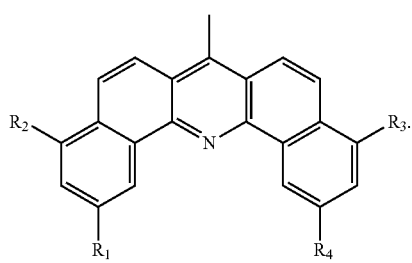

Preferably, Ar and $R_{1-4}$ are independently selected from $C_6$-$C_{20}$-aryl and $C_5$-$C_{20}$-heteroaryl.

More preferably heteroaryl is a C5-C20 condensed ring structure in which one or two C are substituted by N or S.

In a further preferred embodiment, $R_5$ is H or F and combines with Ar to a moiety selected from

TABLE 1

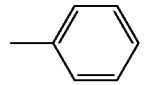

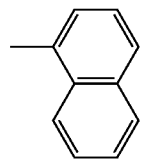

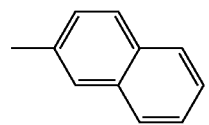

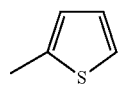

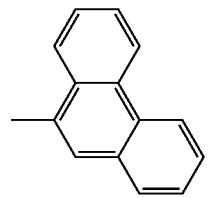

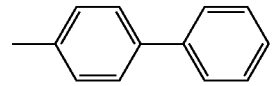

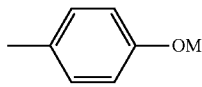

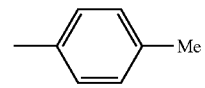

TABLE 1-continued
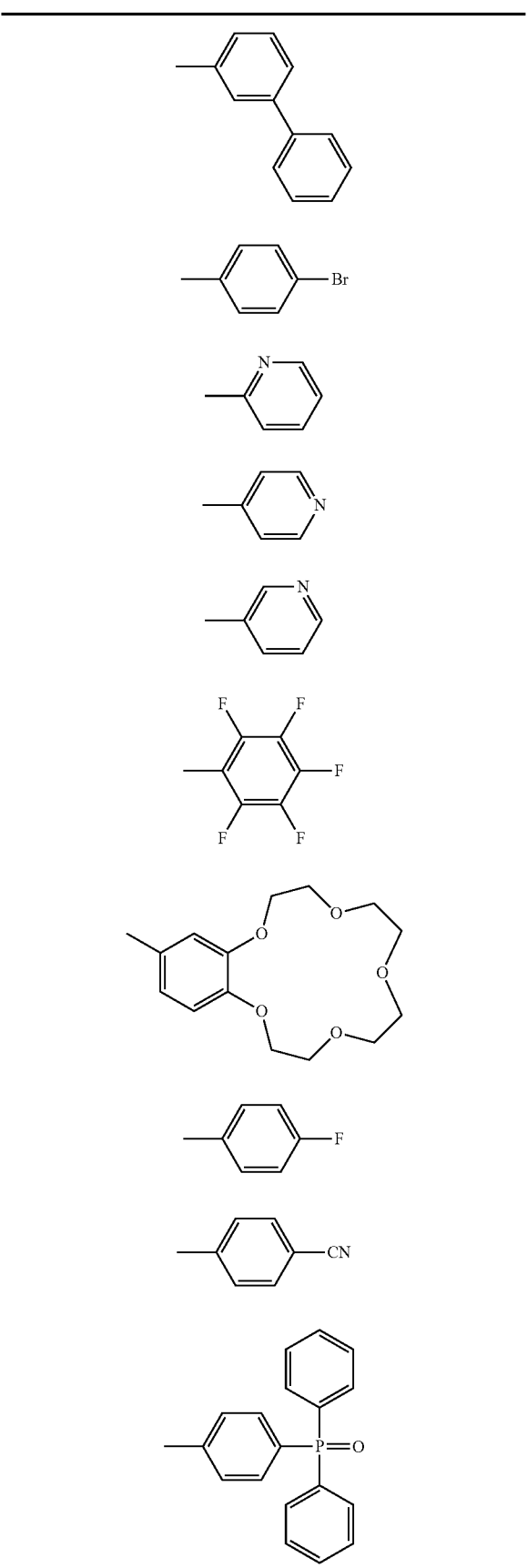
TABLE 1-continued
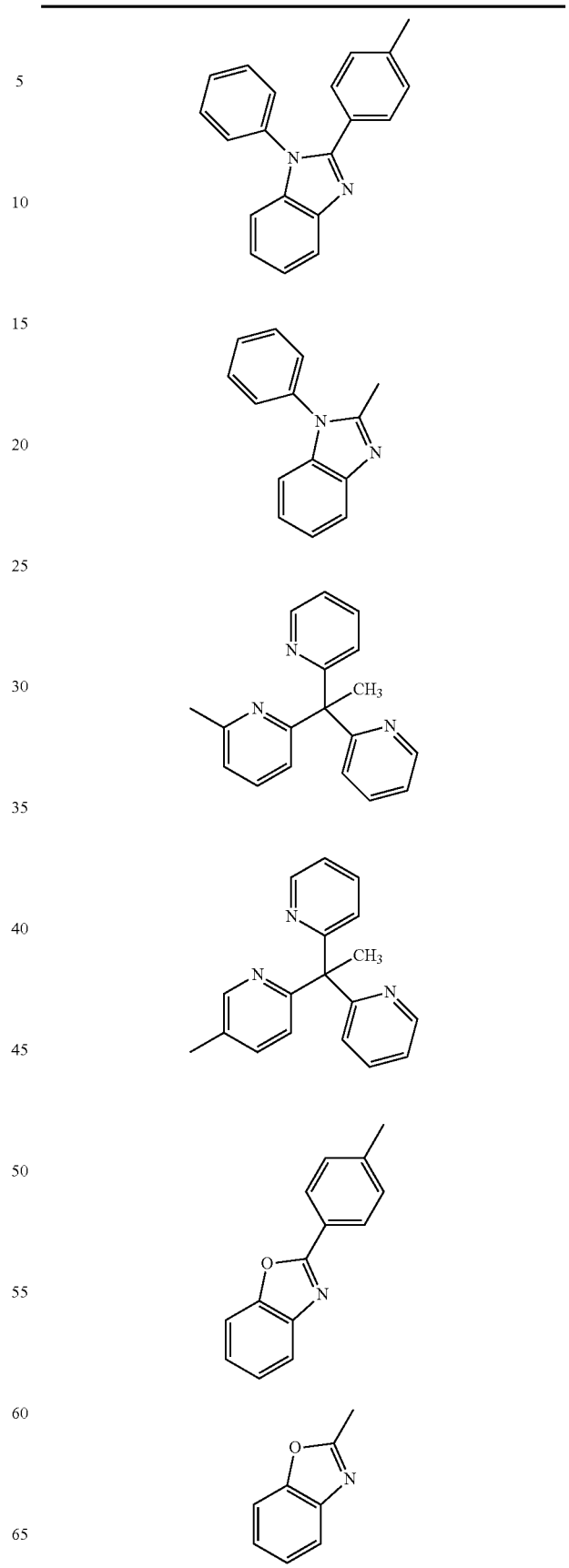

TABLE 1-continued

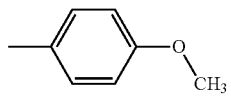

5

It is clear from the above formulae that the open bonds are, as well as in the other compounds illustrated within this application, not to be understood to be methyl, but this open bond is the one performing the covalent bond to the residual moiety of formula (I).

In another preferred embodiment, compounds according to formula (I) are prepared with $R_5 \neq H$ or F, but with Ar being C6-C20-aryl or C5-C20-heteroaryl; preferably Ar having the structures as illustrated above, and wherein preferably R1-R4 is H, C6-C20-aryl or C5-C20-heteroaryl.

In a further preferred embodiment, Ar is selected from

TABLE 2

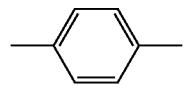

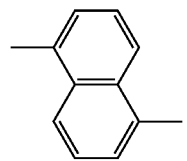

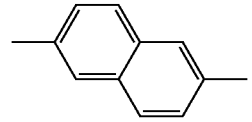

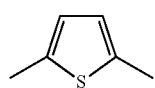

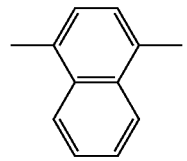

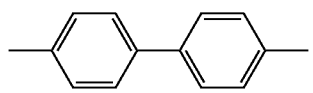

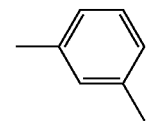

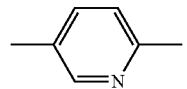

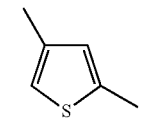

TABLE 2-continued

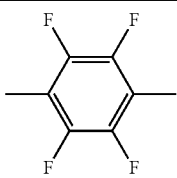

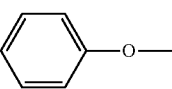

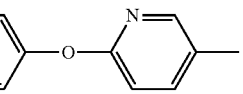

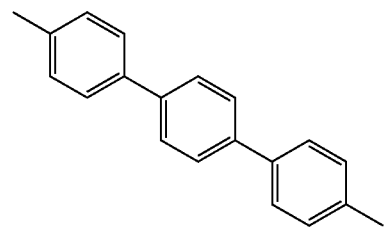

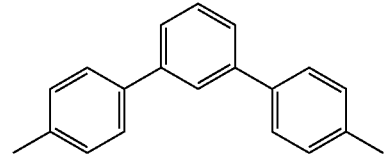

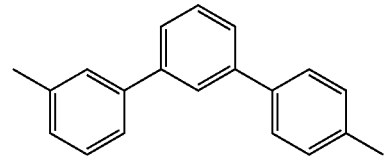

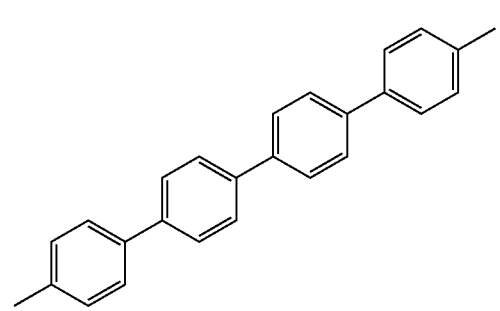

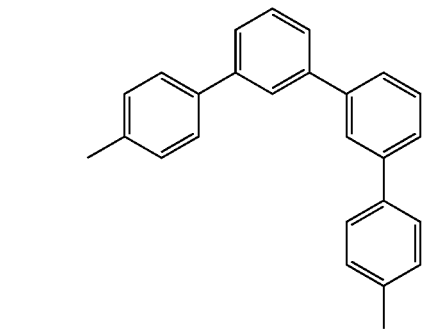 [SMILES: Cc1ccc(-c2cccc(-c3cccc(-c4ccc(C)cc4)c3)c2)cc1]

TABLE 2-continued

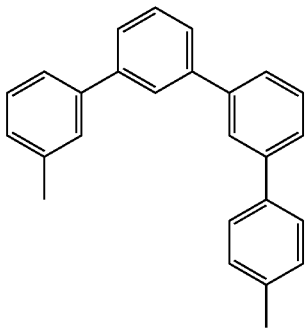 [SMILES: Cc1ccc(-c2cccc(-c3cccc(-c4cccc(C)c4)c3)c2)cc1]

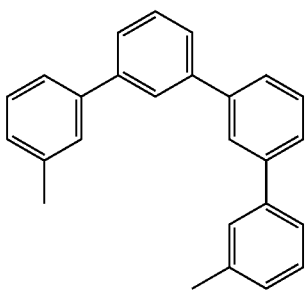 [SMILES: Cc1cccc(-c2cccc(-c3cccc(-c4cccc(C)c4)c3)c2)c1]

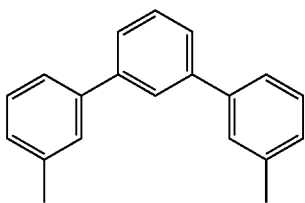 [SMILES: Cc1cccc(-c2cccc(-c3cccc(C)c3)c2)c1]

In a further preferred embodiment, Ar is selected from Table 2 and combines with R5 which is selected from Table 1.

It is preferred that the device is an electronic, optoelectronic or electroluminescent device having an electronically functionally effective region, wherein the electronically effective region comprises at least one compound according to formula (I) as defined above.

Even preferred, the device has a layered structure and at least one layer comprises at least one compound according to formula (I) as defined above.

Most preferred, the organic semiconducting material is doped by an n-dopant.

In another embodiment, the device with a layered structure has at least two layers of the organic semiconducting material comprising a compound of formula (I), one n-doped and the other undoped. Preferably both layers are in direct contact.

The organic semiconducting material may be doped by an organic n-dopant which dopant has HOMO energy level which is more positive than −3.3 eV.

The device may be preferably an organic light-emitting diode, a field-effect transistor, a sensor, a photodetector, an organic thin-film transistor, an organic integrated circuit, an organic light-emitting transistor, a light-emitting electrochemical cell or an organic laser diode. It was found out that the organic semiconducting materials comprising a compound of formula (I) are especially suitable to be used in electron transport layers in OLEDs.

According to the invention are also compounds according to formula (I), except for the compound in which R5=H and Ar is

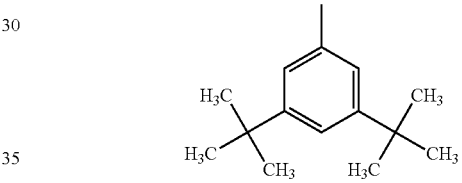

Most preferred structures of the compound of formula (I) can be as follows in table 3:

TABLE 1

Structure 1

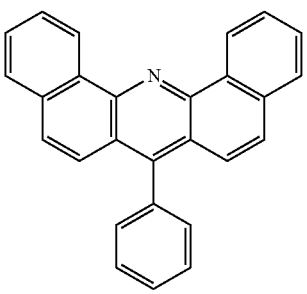 [SMILES: c1ccc(-c2c3ccc4ccccc4c3nc3c2ccc2ccccc23)cc1]

Structure 2

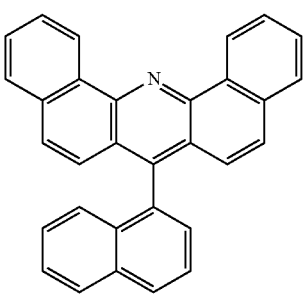 [SMILES: c1ccc2c(-c3c4ccc5ccccc5c4nc4c3ccc3ccccc34)cccc2c1]

TABLE 1-continued
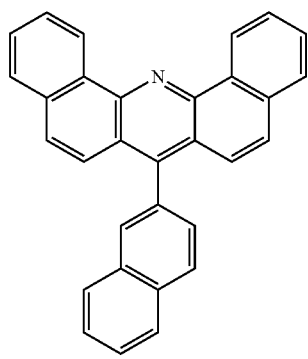 [SMILES: c1ccc2cc(-c3c4ccc5ccccc5c4nc4c3ccc3ccccc34)ccc2c1]
Structure 3
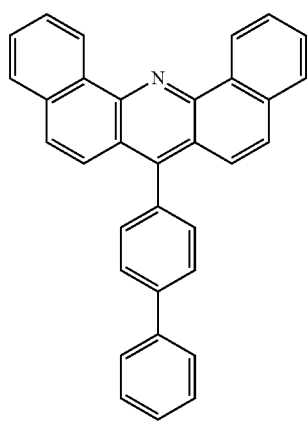 [SMILES: c1ccc(-c2ccc(-c3c4ccc5ccccc5c4nc4c3ccc3ccccc34)cc2)cc1]
Structure 4
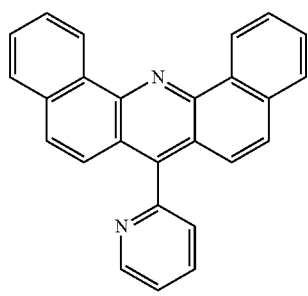 [SMILES: c1ccc(-c2c3ccc4ccccc4c3nc3c2ccc2ccccc23)nc1]
Structure 5
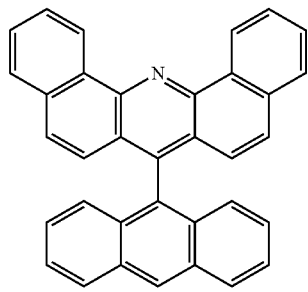 [SMILES: c1ccc2c(-c3c4ccc5ccccc5c4nc4c3ccc3ccccc34)c3ccccc3cc2c1]
Structure 6

TABLE 1-continued
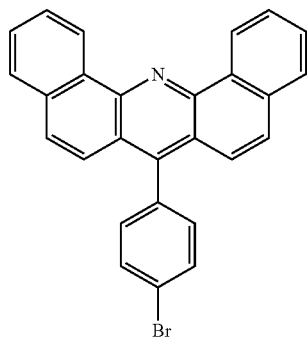 [SMILES: Brc1ccc(-c2c3ccc4ccccc4c3nc3c2ccc2ccccc23)cc1]
Structure 7
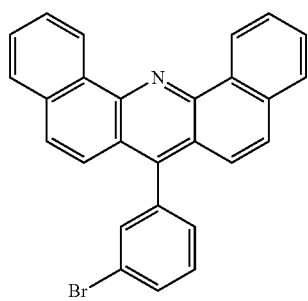 [SMILES: Brc1cccc(-c2c3ccc4ccccc4c3nc3c2ccc2ccccc23)c1]
Structure 8
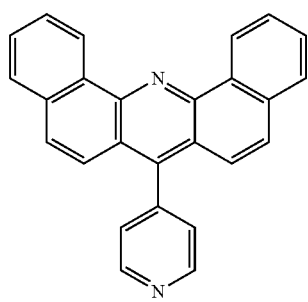 [SMILES: c1ccc2c(c1)ccc1c(-c3ccncc3)c3ccc4ccccc4c3nc12]
Structure 9
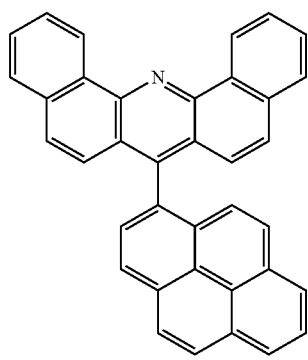 [SMILES: c1ccc2c(c1)ccc1c(-c3ccc4ccc5cccc6ccc3c4c56)c3ccc4ccccc4c3nc12]
Structure 10
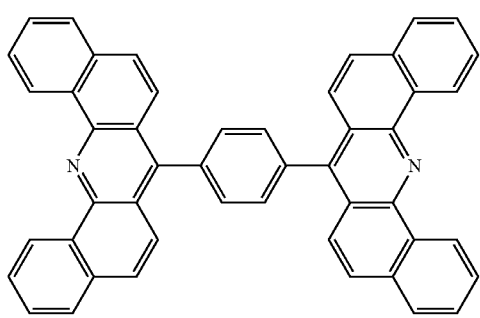 [SMILES: c1ccc2c(c1)ccc1c(-c3ccc(-c4c5ccc6ccccc6c5nc5c4ccc4ccccc45)cc3)c3ccc4ccccc4c3nc12]
Structure 11

TABLE 1-continued
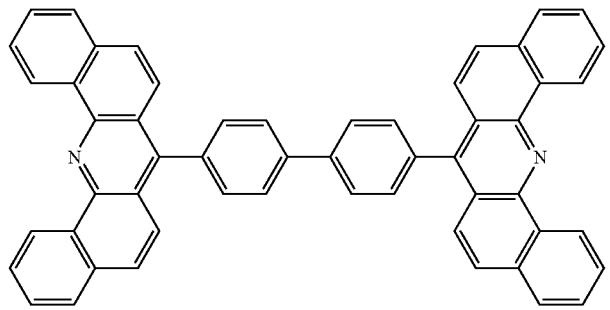 [SMILES: c1ccc2c(c1)ccc1c(-c3ccc(-c4ccc(-c5c6ccc7ccccc7c6nc6c5ccc5ccccc56)cc4)cc3)c3ccc4ccccc4c3nc12]
Structure 12
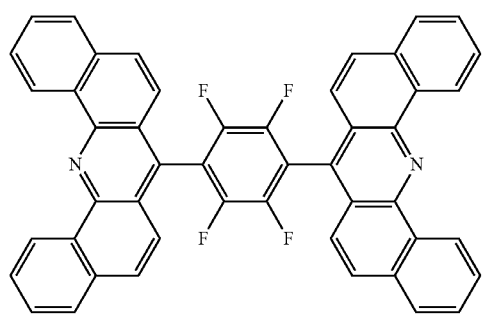 [SMILES: Fc1c(F)c(-c2c3ccc4ccccc4c3nc3c2ccc2ccccc23)c(F)c(F)c1-c1c2ccc3ccccc3c2nc2c1ccc1ccccc12]
Structure 13
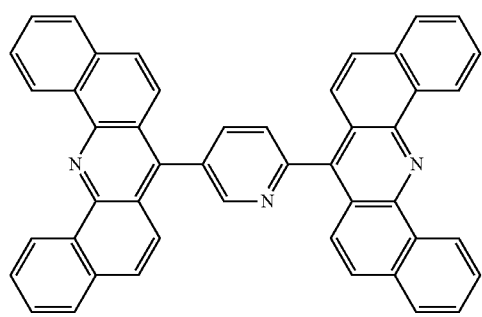 [SMILES: c1ccc2c(c1)ccc1c(-c3ccc(-c4c5ccc6ccccc6c5nc5c4ccc4ccccc45)nc3)c3ccc4ccccc4c3nc12]
Structure 14
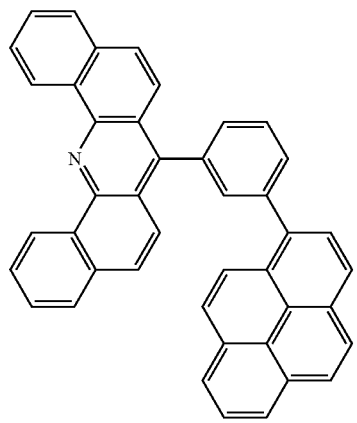 [SMILES: c1cc(-c2c3ccc4ccccc4c3nc3c2ccc2ccccc23)cc(-c2ccc3ccc4cccc5ccc2c3c45)c1]
Structure 16

TABLE 1-continued
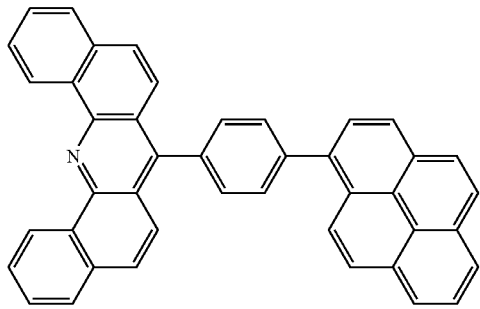 [SMILES: c1ccc2c(c1)ccc1c(-c3ccc(-c4ccc5ccc6cccc7ccc4c5c67)cc3)c3ccc4ccccc4c3nc12]
Structure 17
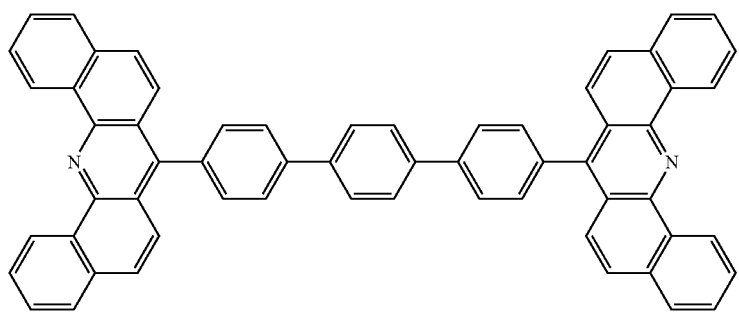 [SMILES: c1ccc2c(c1)ccc1c(-c3ccc(-c4ccc(-c5ccc(-c6c7ccc8ccccc8c7nc7c6ccc6ccccc67)cc5)cc4)cc3)c3ccc4ccccc4c3nc12]
Structure 18
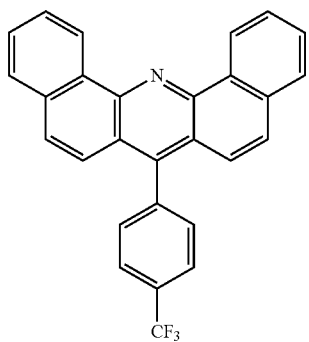 [SMILES: FC(F)(F)c1ccc(-c2c3ccc4ccccc4c3nc3c2ccc2ccccc23)cc1]
Structure 19
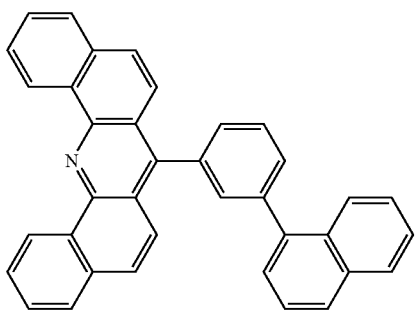 [SMILES: c1cc(-c2cccc3ccccc23)cc(-c2c3ccc4ccccc4c3nc3c2ccc2ccccc23)c1]
Structure 20

TABLE 1-continued
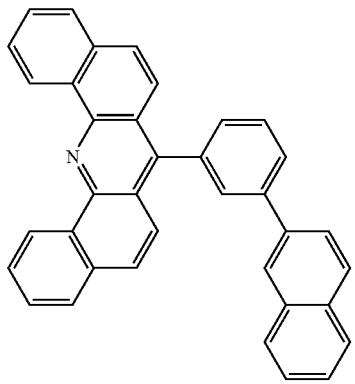 [SMILES: c1cc(-c2ccc3ccccc3c2)cc(-c2c3ccc4ccccc4c3nc3c2ccc2ccccc23)c1]
Structure 21
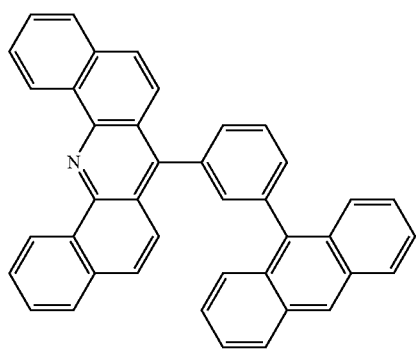 [SMILES: c1cc(-c2c3ccccc3cc3ccccc23)cc(-c2c3ccc4ccccc4c3nc3c2ccc2ccccc23)c1]
Structure 22
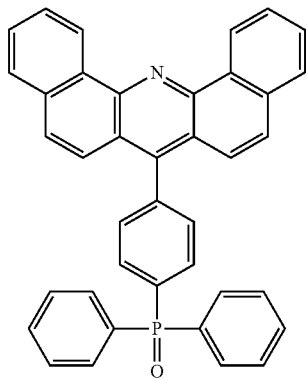 [SMILES: O=P(c1ccccc1)(c1ccccc1)c1ccc(-c2c3ccc4ccccc4c3nc3c2ccc2ccccc23)cc1]
Structure 23
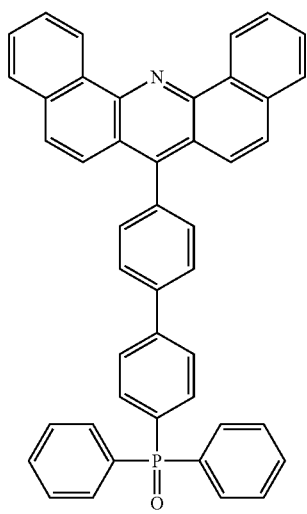 [SMILES: O=P(c1ccccc1)(c1ccccc1)c1ccc(-c2ccc(-c3c4ccc5ccccc5c4nc4c3ccc3ccccc34)cc2)cc1]
Structure 24

TABLE 1-continued
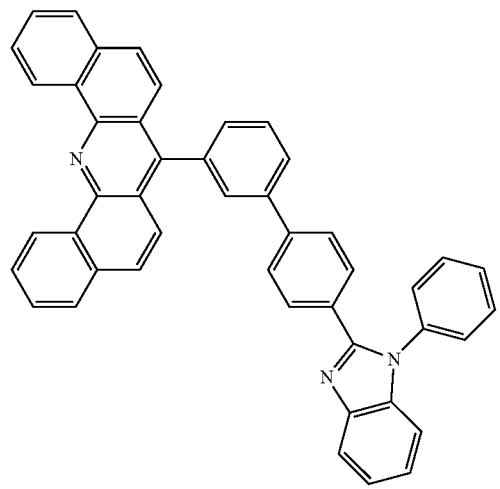 [SMILES: c1ccc(-n2c(-c3ccc(-c4cccc(-c5c6ccc7ccccc7c6nc6c5ccc5ccccc56)c4)cc3)nc3ccccc32)cc1]
Structure 25
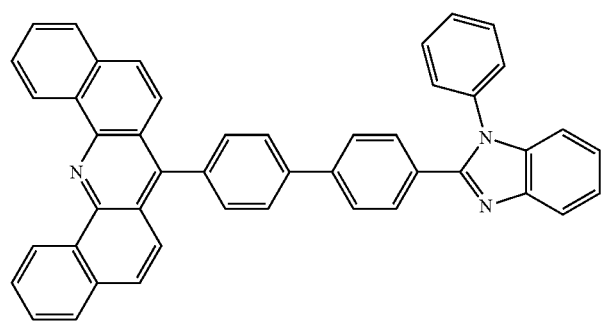 [SMILES: c1ccc(-n2c(-c3ccc(-c4ccc(-c5c6ccc7ccccc7c6nc6c5ccc5ccccc56)cc4)cc3)nc3ccccc32)cc1]
Structure 26
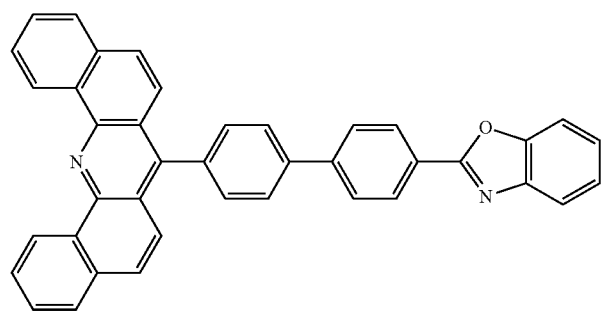 [SMILES: c1ccc2c(c1)ccc1c(-c3ccc(-c4ccc(-c5nc6ccccc6o5)cc4)cc3)c3ccc4ccccc4c3nc12]
Structure 27
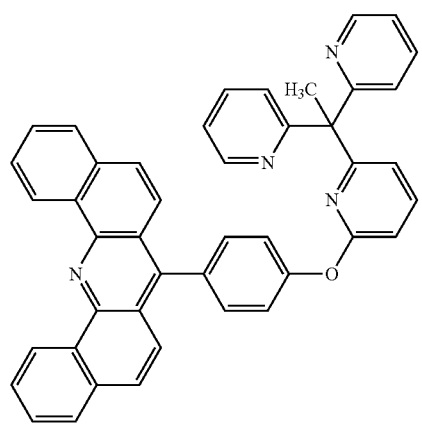 [SMILES: CC(c1ccccn1)(c1ccccn1)c1cccc(Oc2ccc(-c3c4ccc5ccccc5c4nc4c3ccc3ccccc34)cc2)n1]
Structure 28

TABLE 1-continued
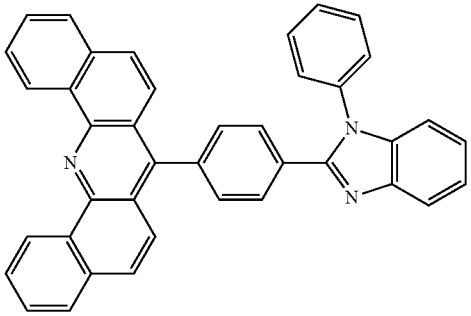 [SMILES: c1ccc(-n2c(-c3ccc(-c4c5ccc6ccccc6c5nc5c4ccc4ccccc45)cc3)nc3ccccc32)cc1]
Structure 29
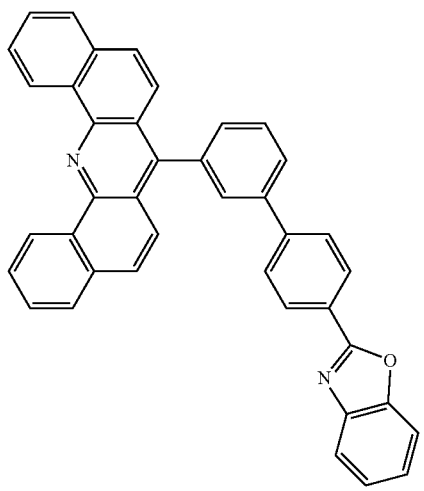 [SMILES: c1cc(-c2ccc(-c3nc4ccccc4o3)cc2)cc(-c2c3ccc4ccccc4c3nc3c2ccc2ccccc23)c1]
Structure 30
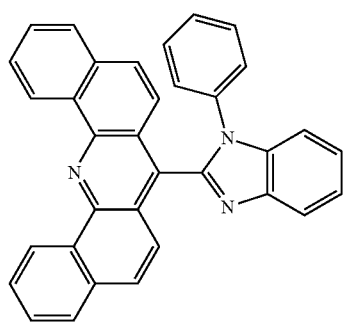 [SMILES: c1ccc(-n2c(-c3c4ccc5ccccc5c4nc4c3ccc3ccccc34)nc3ccccc32)cc1]
Structure 31
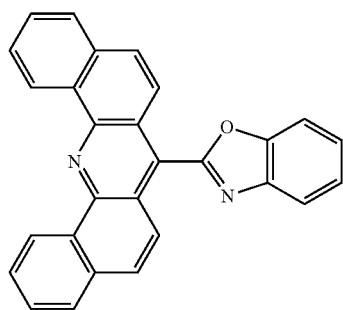 [SMILES: c1ccc2c(c1)ccc1c(-c3nc4ccccc4o3)c3ccc4ccccc4c3nc12]
Structure 32

TABLE 1-continued

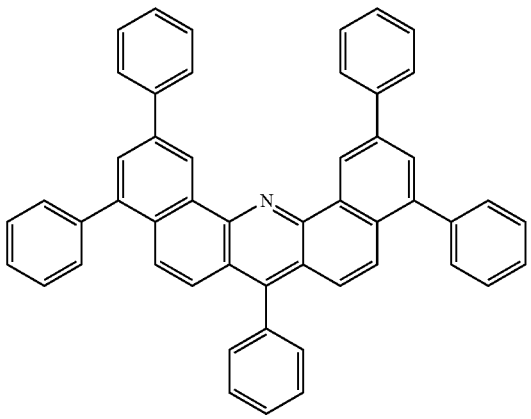 [SMILES: c1ccc(-c2cc(-c3ccccc3)c3ccc4c(-c5ccccc5)c5ccc6c(-c7ccccc7)cc(-c7ccccc7)cc6c5nc4c3c2)cc1]

Structure 33

As can be taken from above list, Ar and can be selected from a number of differently substituted or unsubstituted $C_6$-$C_{20}$-aryl or $C_5$-$C_{20}$-heteroaryl. Suitable substituents may be for example halogen, such as Br, Aryl, pyrene, or $CF_3$.

An organic n-dopant can be, for example, selected from the dopants as disclosed in EP 2002492 A1, US 2007252140 or US 2009212280.

According to the invention is also an electronic device comprising an organic semiconducting material comprising at least one organic matrix material which is optionally doped with at least one dopant, wherein the matrix material comprises at least one compound according to formula (I).

In a light-emitting diode the compounds according to formula (I) can be used in electron transport layers, which might be optionally doped. The compounds can be also used in light-emitting diodes in interlayers such as hole blocking layers.

According to the invention, the compounds are preferably used in the electron transport layer and not as main compound of the emitter layer, preferably they are not used in the emitter layer at all.

According to the invention, especially a window semiconducting organic material is provided for the device that can be electrically doped achieving a high conductivity while it remains highly transparent in the visible spectra and has a high thermal stability.

According to the invention, also an organic field-effect transistor can be provided comprising at least one compound according to formula (I) for use in a transport layer, in other words, in the semiconducting channel layer. An organic field effect transistor may also comprise at least one compound as disclosed as electronically inert buffer layer, when no charge is injected due to high potential barrier. An organic field effect transistor may also comprise at least one compound as disclosed as doped injection layer.

The compounds used in this invention according to formula (I) can be used in OLEDs in electron transport layers as a neat layer, or as a doped layer in combination with a redox dopant. The compounds can also be used in mixture with other electron transport materials, with other hole transport materials or with other functional materials such as emitter dopants. The compounds can be used as hole blocking layers. Advantageous effects are seen over the prior art since the materials have a higher glass transition temperature compared to materials described in the prior art, such as in DE 10 2007 012 794 or EP 2072517.

The use of the compounds according to formula (I) provides high thermal stability, especially due to high glass transition temperature, a good LUMO position for organic light-emitting devices, good dopability, conductivity and charge carrier mobility, high transparency, and easy synthesis. Further, preparation of these compounds can be conducted in a very cost-effective manner. Finally, it can be pointed out that the synthesis of such compounds offers a high flexibility to change independently the R and X, $Ar_1$ or $Ar_2$ groups which opens access to more complex compounds and therefore to different physical/chemical properties resulting in a fine tuning thereof.

It was surprisingly found that especially the thermal stability of doped layers comprising a compound as disclosed can be significantly increased in the devices according to the present invention comprising matrix material. Especially, a glass transition temperature of over 100° C. was achieved with the compounds shown in the examples. The combination of such a high glass temperature, the wide gap and the dopability make those compounds to have a high industrial relevance for use in organic electronic devices.

The properties of the many different used materials can be described by the position of their highest occupied molecular orbital energy level (HOMO, synonym of ionization potential), and the lowest unoccupied molecular orbital energy level (LUMO, synonym of electron affinity).

A method to determine the ionization potentials (IP) is the ultraviolet photo spectroscopy (UPS). It is usual to measure the ionization potential for solid state materials; however, it is also possible to measure the IP in the gas phase. Both values are differentiated by their solid state effects, which are, for example the polarization energy of the holes that are created during the photo ionization process. A typical value for the polarization energy is approximately 1 eV, but larger discrepancies of the values can also occur. The IP is related to beginning of the photoemission spectra in the region of the large kinetic energy of the photoelectrons, i.e. the energy of the most weakly bounded electrons. A related method to UPS, the inverted photo electron spectroscopy (IPES) can be used to determine the electron affinity (EA). However, this method is less common. Electrochemical measurements in solution are an alternative to the determination of solid state oxidation (Eox) and reduction (Ered) potential. An adequate method is for example the cyclo-voltammetry. Empiric methods for the extraction of the solid state ionization potentials are known from the literature. There are no known empiric equations for the conversion of reduction potentials into electron affinities.

The reason for that is the difficulty of the determination of the electron affinity. Therefore, a simple rule is used very often: IP=4.8 eV+e*Eox (vs. Ferrocen/Ferrocenium) and EA=4.8 eV+e*Ered (vs. Ferrocen/Ferrocenium) respectively (see B. W. Andrade, Org. Electron. 6, 11 (2005) and Refs. 25-28 therein). Processes are known for the correction of the electrochemical potentials in the case other reference electrodes or other redox pairs are used (see A. J. Bard, L. R. Faulkner, "Electrochemical Methods: Fundamentals and Applications", S. 1-28, and S. 239-247, Wiley, 2. Ausgabe 2000). The information about the influence of the solution used can be found in N. G. Connelly et al., Chem. Rev. 96, 877 (1996). It is usual, even if not exactly correct to use the terms "energy of the HOMO" E(HOMO) and "energy of the LUMO" E(LUMO) respectively as synonyms for the ionization energy and electron affinity (Koopmans Theorem). It has to be taken in consideration, that the ionization potentials and the electron affinities are given in such a way that a larger value represents a stronger binding of a released or respectively of an absorbed electron. The energy scale of the molecular orbitals (HOMO, LUMO) is opposed to this. Therefore, in a rough approximation, is valid: IP=−E (HOMO) and EA=E(LUMO). The given potentials correspond to the solid-state potentials. Hole transport layers, including the respective blockers, mostly have HOMO in the range from −4.5 to −5.5 eV (below the vacuum level) and LUMO in the range of −1.5 eV to −3 eV. The HOMO levels of the emitter materials are in the range of −5 eV to −6.5 eV, and the LUMO in the range from −2 to −3 eV. Electron transport materials, including their respective blockers, have their HOMO in a range of −5.5 eV to −6.8 eV and LUMO in the range of −2.3 eV to −3.3 eV. The work function of the contact materials is around −4 to −5 eV for the anode and −3 to −4.5 eV for the cathode.

The dopant donor is a molecule or a neutral radical or combination thereof with a HOMO energy level (ionization potential in solid state) more positive than −3.3 eV, preferably more positive than −2.8 eV, more preferably more positive than −2.6 eV. The HOMO of the donor can be estimated by cyclo-voltammetric measurements. An alternative way to measure the reduction potential is to measure the cation of the donor salt. The donor has to exhibit an oxidation potential that is smaller than or equal to −1.5 V vs Fc/Fc+ (Ferrum/Ferrocenium redox-pair), preferably smaller than −1.5 V, more preferably smaller than or equal to approximately −2.0 V, even more preferably smaller than or equal to −2.2 V. The molar mass of the donor is in a range between 100 and 2000 g/mol, preferably in a range from 200 and 1000 g/mol. The molar doping concentration is in the range of 1:10000 (dopant molecule:matrix molecule) and 1:2, preferably between 1:100 and 1:5, more preferably between 1:100 and 1:10. In individual cases doping concentrations larger than 1:2 are applied, e.g. if large conductivities are required. The donor can be created by a precursor during the layer forming (deposition) process or during a subsequent process of layer formation (see DE 10307125.3). The above given value of the HOMO level of the donor refers to the resulting molecule or molecule radical.

A dopant acceptor is a molecule or a neutral radical or combination thereof with a LUMO level more negative than −4.5 eV, preferably more negative than −4.8 eV, more preferably more negative than −5.04 eV. The LUMO of the acceptor can be estimated by cyclo-voltammetric measurements. The acceptor has to exhibit a reduction potential that is larger than or equal to approximately −0.3 V vs Fc/Fc+(Ferrum/ Ferrocenium redox-pair), preferably larger than or equal to 0.0 V, preferably larger than or equal to 0.24 V. The molar mass of the acceptor is preferably in the range of 100 to 2000 g/mol, more preferably between 200 and 1000 g/mol, and even more preferably between 300 g/mol and 2000 g/mol. The molar doping concentration is in the range of 1:10000 (dopant molecule:matrix molecule) and 1:2, preferably between 1:100 and 1:5, more preferably between 1:100 and 1:10. In individual cases doping concentrations larger than 1:2 are applied, e.g. if large conductivities are required. The acceptor can be created by a precursor during the layer forming (deposition) process or during a subsequent process of layer formation. The above given value of the LUMO level of the acceptor refers to the resulting molecule or molecule radical.

By using the term doping it is meant electrical doping as explained above. This doping can also be called redox-doping or charge transfer doping. It is known that the doping increases the density of charge carriers of a semiconducting matrix towards the charge carrier density of the undoped matrix. An electrically doped semiconductor layer also has an increased effective mobility in comparison with the undoped semiconductor matrix.

The conductivity can be, for example, measured by the so-called 2-point or 4-point-method. Here, contacts of a conductive material, such as gold or indium-tin-oxide, are disposed on a substrate. Then, the thin film to be examined is applied onto the substrate, so that the contacts are covered by the thin film. After applying a voltage to the contacts the current is measured. From the geometry of the contacts and the thickness of the sample the resistance and therefore the conductivity of the thin film material can be determined. The four point or two point method give the same conductivity values for doped layers since the doped layers grant a good ohmic contact.

The temperature stability can also be measured with that method in which the (undoped or doped) layer is heated stepwise, and after a waiting period, the conductivity is measured. The maximum temperature, which can be applied to the layer without loosing the desired semiconducting properties, is then the temperature just before the conductivity breaks down. For example, a doped layer can be heated on the substrate with two electrodes, as disclosed above, in steps of 1° C., wherein after each step there is a waiting period of 10 seconds. Then the conductivity is measured. The conductivity changes with temperature and breaks down abruptly at a particular temperature. The temperature stability is therefore the temperature up to which the conductivity does not break down abruptly. The measurement is performed in vacuum.

In another aspect of the invention, the compounds according to formula (I) are used in an organic light emitting diode as electron transport materials in an ETL which is undoped (not electrically doped). In another aspect, the ETL is mixed with an organometallic-complex, preferentially a Li compound, such as LiQ. In such cases, it is preferred that the transporting host of the emitting layer is preferentially electron transporting, either because it has higher electron mobility or because electrons are more easily injected than holes, due to the HOMO and LUMO energy levels of the emitting layer host and its adjacent layer's hosts. In still another aspect, the ETL consists of the compound according to formula (I).

Additional features and advantages of the invention can be taken from the following detailed description of preferred embodiments, together with the drawings as attached.

BRIEF DESCRIPTION OF THE DRAWINGS

FIG. 1 shows a cross section of a typical exemplary small molecule OLED.

The organic electronic device of the present invention may be an organic light emitting diode. FIG. 1 shows a typical layer structure of an organic light emitting diode. The layers are disposed on a substrate (10) in the following order: anode (11), p-doped hole transport layer (12), electron blocking layer (13), emission layer (14), hole blocking layer (15), n-electron transport layer (16), and cathode (17). Two or more layers can collapse into a smaller number of layers if properties can be combined. Inverted structure and multiple stacked OLEDs are also well known in the field. The emission layer is usually composed by an emitter matrix material and an emitter dopant; this layer can be also composed by several other layers to generate light with a broad spectrum combining several emitters, for example, to generate white light.

EXAMPLES

General Synthesis Method

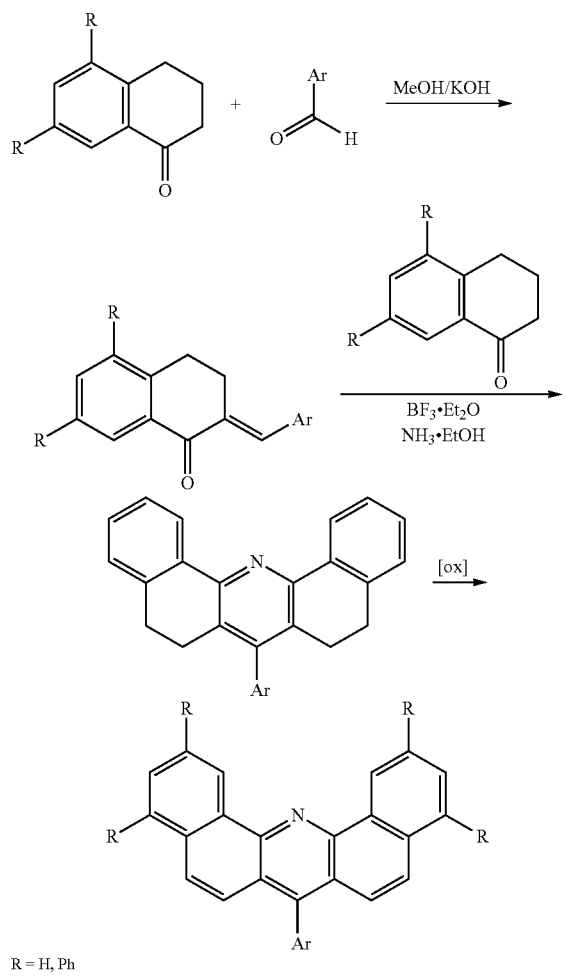

R = H, Ph

Of course, the R's in the above general synthesis scheme shall stand for $R_{1-4}$ according to formula (I). Additionally, Ar shall in this general synthesis scheme be understood to stand for the moiety "Ar—$R_5$" according to formula (I).

R1-4 are independently introduced in steps 1 and/or 2 of the general synthesis scheme by choosing the proper tetralone derivative (such as 6-fluoro-3,4-dihydro-7-methoxy-1(2H) naphthalenone or 3,4-dihydro-5,8-dimethyl-1(2H)-naphthalenone, or 6,7-dichloro-3,4-dihydro 1(2H)-naphthalenone, or, 3,4-dihydro-6-nitro-1(2H)-naphthalenone, or 3,4-dihydro-7-phenyl-1(2H)-naphthalenone which are all commercial materials.

Example 1

Synthesis of

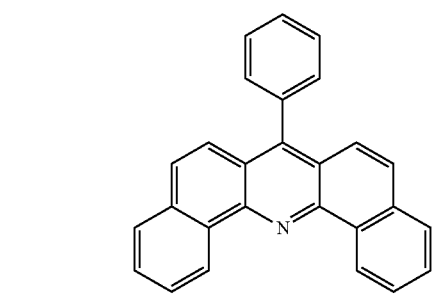 [SMILES: c1ccc(-c2c3ccc4ccccc4c3nc3c2ccc2ccccc23)cc1]

First Step:

Synthesis of 2-benzylidene-3,4-dihydronaphthalen-1 (2H)-one (1). All manipulations were carried out in air, without any further purification of commercial solvents/chemicals.

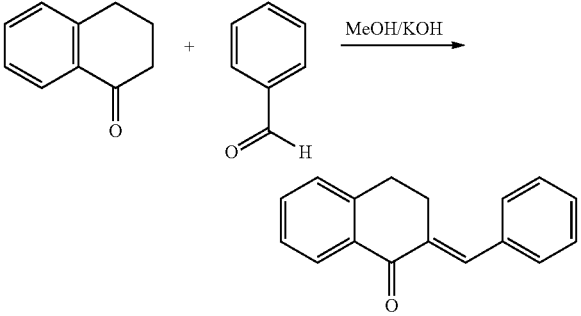

A 250 mL flask was charged with tetralone (4 g, 27.4 mmol) and benzaldehyde (3.88 g, 36.6 mmol). This was dissolved in warm tetrahydrofuran (15 mL), and to this yellow solution was slowly added a 4 wt % solution of KOH in methanol (125 mL). The reaction was stirred for 4 days at room temperature. The solvent was then removed under reduced pressure, and it was poured into 150 mL of water and extracted with methylene chloride. The organic extract was dried over magnesium sulfate and filtered, and the solvent was removed at reduced pressure to afford 4.1 g (64%) as white powder.

NMR: 1H NMR (500 MHz, CD2Cl2) δ 8.01 (dd, J=64.7, 65.4, 2H), 7.71-6.92 (m, 8H), 3.39-2.64 (m, 4H).

Second Step:

Synthesis of 7-phenyl-5,6,8,9-tetrahydrodibenzo[c,h]acridine (2). All manipulations were carried out under argon.

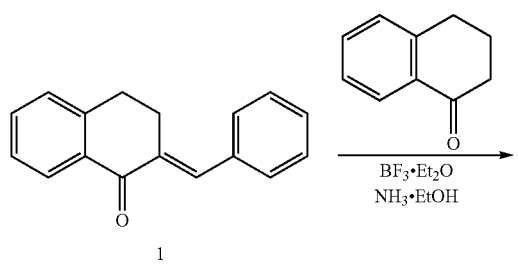

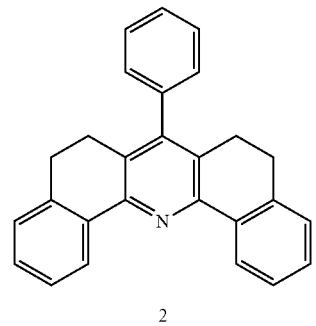

1 (2.9 g, 12.4 mmol) and tetralone (1.7 g, 11.6 mmol) are introduced in a flask together with BF3.Et2O (1.8 mL, 14.2 mmol). The mixture is stirred at 100° C. for 4 hours and cooled to room temperature. Et2O was added (15 mL) and the mixture is stirred for an additional hour. The precipitate is filtered and washed with Et2O (15 mL). This powder (1.9 g) is then introduced at 0° C. in a flask together with a ammonia-ethanol solution. The mixture was allowed to stir at room temperature for 6 h, the solid was filtered and washed several times with ethanol. 1.4 g (34% yield) of a white powder was obtained.

Third Step:

Synthesis of 7-phenyldibenzo[c,h]acridine (3). All manipulations were carried out under argon with dry solvents.

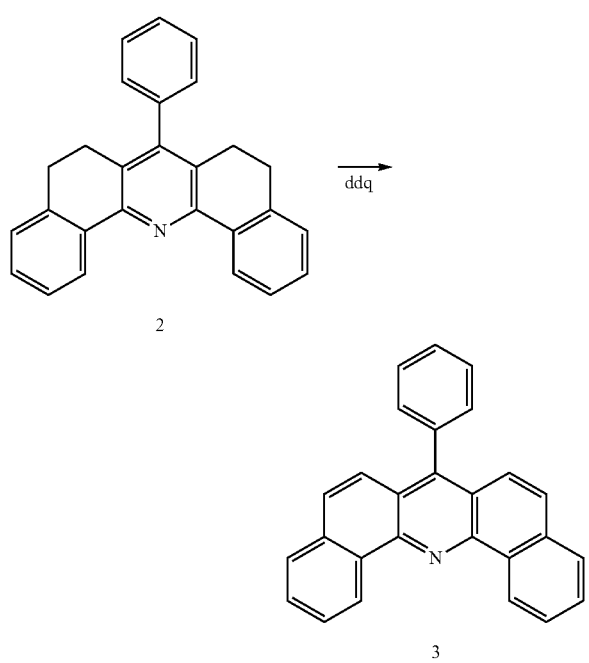

2 (1.55 g, 4.31 mmol) was dissolved in 100 mL dioxane and 2,3-dichloro-5,6-dicyanobenzoquinone was added (6.88 g, 30.3 mmol). The mixture was refluxed under argon for 2 days. The reaction mixture was then cooled to room temperature, poured in 300 mL saturated aqueous sodium carbonate solution and stirred at 65° C. for 30 min. The mixture was then cooled to room temperature, the precipitation was filtered and washed with water and methylene chloride. Yield: 1.1 g (72%).

1H NMR (500 MHz, CD2Cl2) δ 8.02-7.94 (m, 4H), 7.86 (dd, J=1.2, 7.8, 2H), 7.71 (ddd, J=5.9, 11.0, 25.9, 3H), 7.45 (dd, J=7.3, 8.4, 4H), 7.20 (d, J=8.7, 2H), 7.05 (ddd, J=1.5, 7.0, 8.6, 2H).

Example 2

Synthesis of

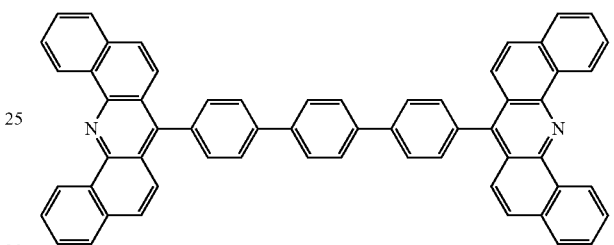

First Step:

Synthesis of (E)-2-(4-bromobenzylidene)-3,4-dihydronaphthalen-1(2H)-one (4). All manipulations were carried out in air, without any further purification of commercial solvents/chemicals.

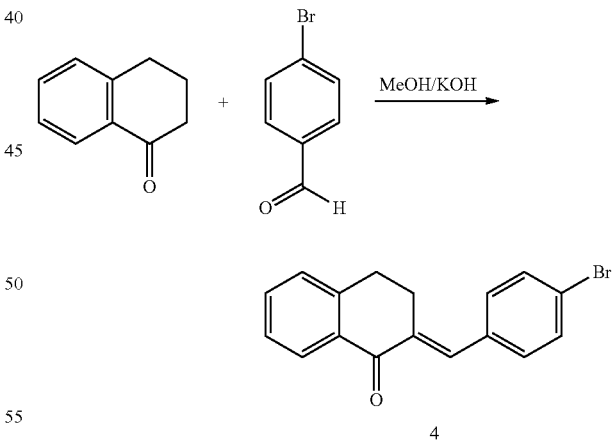

A 250 mL flask was charged with tetralone (3.22 g, 22 mmol) and 4-bromobenzaldehyde (5.3 g, 28.6 mmol). This was dissolved in warm tetrahydrofuran (12 mL), and to this yellow solution was slowly added a 4 wt % solution of KOH in methanol (100 mL). The reaction was stirred for 4 days at room temperature. The mixture was concentrated and reduced to approx 10% vol. The residue was filtered and washed with MTBE (3*50 mL), dried, to afford a light yellow powder (6.61 g, 96%).

Second Step:

Synthesis of 7-(4-bromophenyl)-5,6,8,9-tetrahydrodibenzo[c,h]acridine (5). All manipulations were carried out under argon.

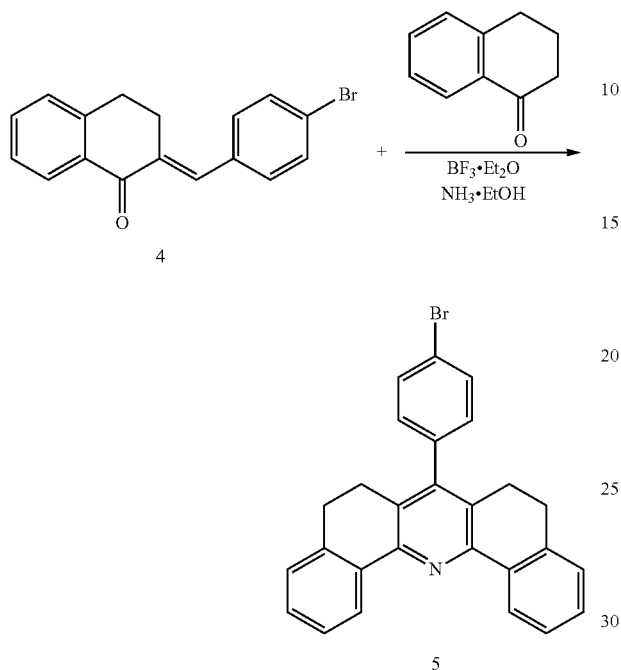

4 (6.54 g, 20.9 mmol) and tetralone (2.93 g, 20.0 mmol) are introduced in a flask together with BF3.Et2O (3 mL, 23.7 mmol). The mixture is stirred at 100° C. for 4 hours and cooled to room temperature. Et2O was added (25 mL) and the mixture is stirred for an additional hour. The precipitate is filtered and washed with $Et_2O$ (20 mL). This powder (3.8 g) is then introduced at 0° C. in a flask together with an ammonia-ethanol solution. The mixture was allowed to stir at room temperature for 5 h, the precipitate was filtered and washed several times with ethanol.

2.98 g (34% yield) of a white powder was obtained.

Third Step:

Synthesis of 7-(4-bromophenyl)dibenzo[c,h]acridine (6). All manipulations were carried out under argon with dry solvents.

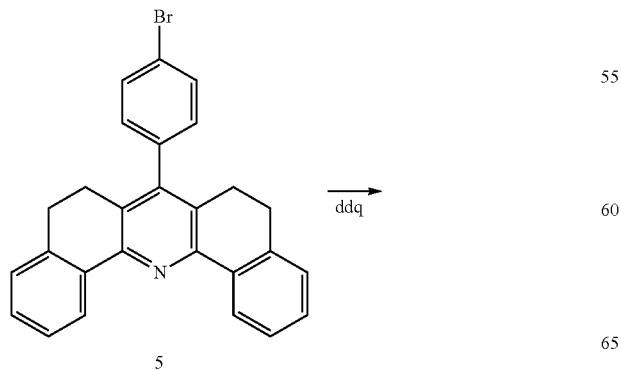

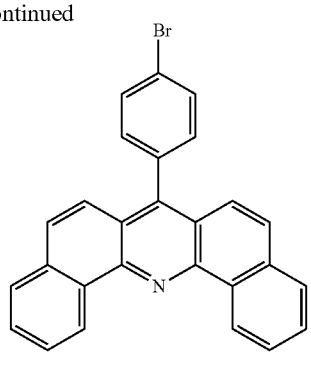

2 (2.98 g, 6.80 mmol) was dissolved in 190 mL dioxane and 2,3-dichloro-5,6-dicyanobenzoquinone was added (10.9 g, 48 mmol). The mixture was refluxed under argon for 2 days. The reaction mixture was then cooled to room temperature, poured in 600 mL saturated aqueous sodium carbonate solution and stirred at 65° C. for 30 min. The mixture was then cooled to room temperature, the precipitation was filtered and washed with water and dichloromethane.

Yield: 2 g (68%). $^1$H NMR (500 MHz, $CD_2Cl_2$) δ (ppm): 9.80 (d, J=8.0, 2H), 8.00-7.68 (m, 10H), 7.53 (d, J=9.2, 2H), 7.45-7.34 (m, 2H).

Fourth Step:

Synthesis of 4,4"-bis(dibenzo[c,h]acridin-7-yl)-1,1':4',1"-terphenyl (7). All manipulations were carried out in air, without any further purification of commercial solvents/chemicals.

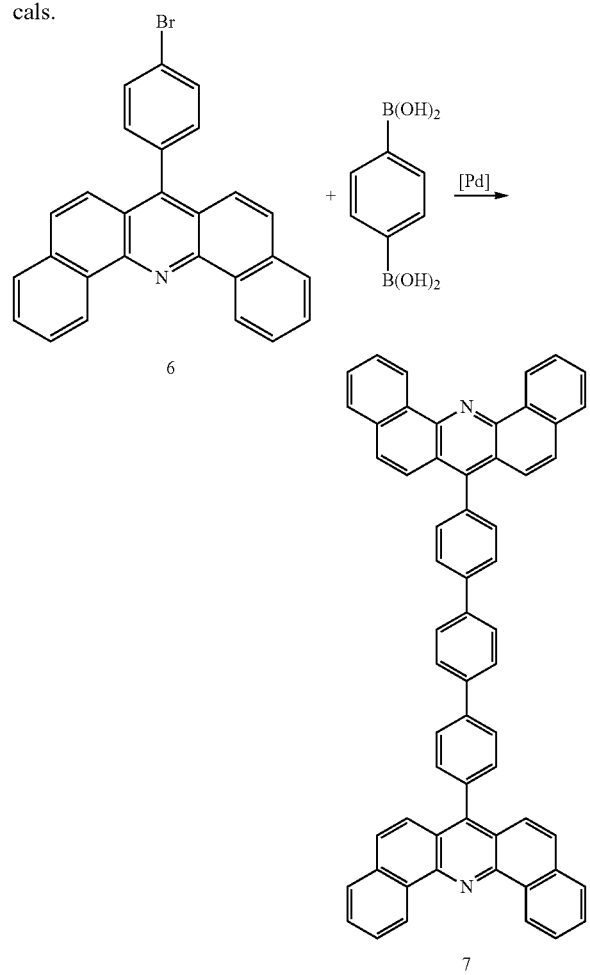

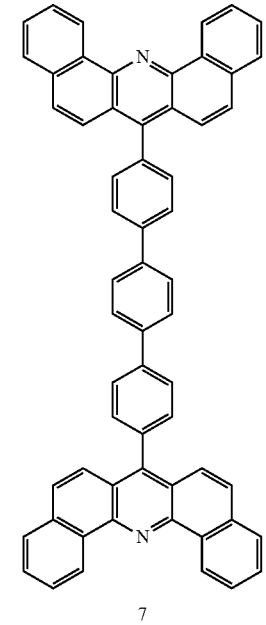

6 (700 mg, 1.61 mmol), 1,4-phenylenediboronic acid (146 mg, 0.88 mmol), Palladium tetrakis triphenylphoshine (186 mg, 0.16 mmol) and potassium carbonate (1.34 g, 9.66 mmol) were introduced in a flask together with 17 mL toluene, 8.8 mL ethanol and 2.6 mL distilled water. This mixture is stirred at 80° C. during 24 hours before being filtered. The solid is then washed with hexane, water and some mL of chloroform before being dried.

Yield: 200 mg (20%).

Example 3

Synthesis of

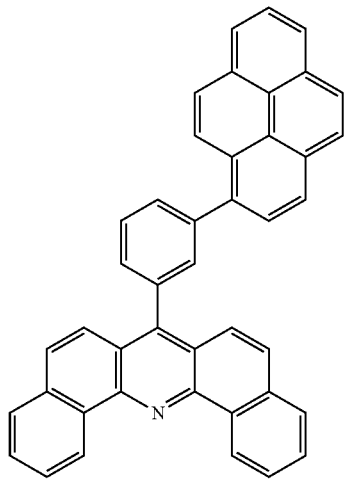 [SMILES: c1cc(-c2c3ccc4ccccc4c3nc3c2ccc2ccccc23)cc(-c2ccc3ccc4cccc5ccc2c3c45)c1]

First Step:

Synthesis of (E)-2-(3-bromobenzylidene)-3,4-dihydronaphthalen-1(2H)-one (8). All manipulations were carried out in air, without any further purification of commercial solvents/chemicals.

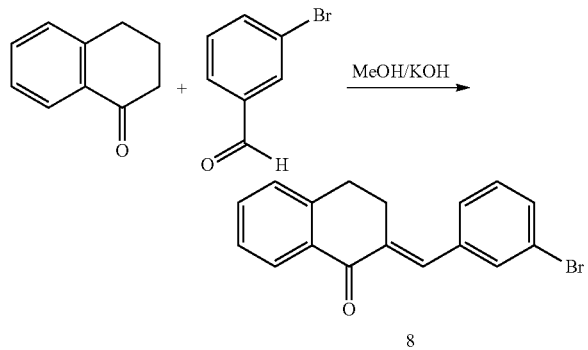

A 250 mL flask was charged with tetralone (5.2 g, 35.6 mmol) and 3-bromobenzaldehyde (8.51 g, 56 mmol). This was dissolved in warm tetrahydrofuran (20 mL), and to this yellow solution was slowly added a 4 wt % solution of KOH in methanol (160 mL). The reaction was stirred for 4 days at room temperature. The mixture was concentrated and reduced to approx 10% vol. The residue was filtered and washed with MTBE (3*50 mL), dried, to afford a light yellow powder (10.3 g, 92%).

NMR: 1H NMR (500 MHz, CD2Cl2) δ 8.01 (dd, J=64.7, 65.4, 2H), 7.71-6.92 (m, 8H), 3.39-2.64 (m, 4H).

Second Step:

Synthesis of 7-(3-bromophenyl)-5,6,8,9-tetrahydrodibenzo[c,h]acridine (9). All manipulations were carried out under argon.

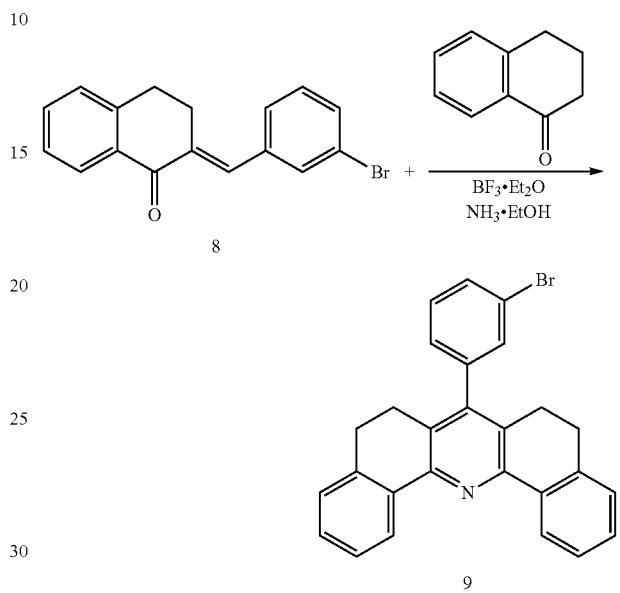

4 (10.2 g, 32.6 mmol) and tetralone (4.52 g, 30.9 mmol) are introduced in a flask together with BF3.Et2O (4.7 mL, 37.1 mmol). The mixture is stirred at 100° C. for 4 hours and cooled to room temperature. Et₂O was added (70 mL) and the mixture is stirred for an additional hour. The precipitate is filtered and washed with Et₂O (20 mL). This powder (5.6 g) is then introduced at 0° C. in a flask together with an ammonia-ethanol solution. The mixture was allowed to stir at room temperature for 5 h, the solid was filtered and washed several times with ethanol.

4.5 g (33% yield) of a white powder was obtained.

Third Step:

Synthesis of 7-(3-bromophenyl)dibenzo[c,h]acridine (10). All manipulations were carried out under argon and with dry solvents.

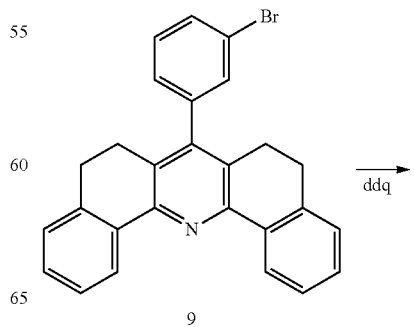

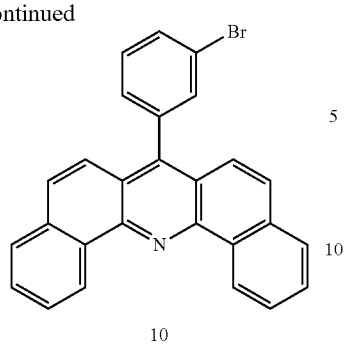

2 (4.49 g, 10.2 mmol) was dissolved in 220 mL dioxane and 2,3-dichloro-5,6-dicyanobenzoquinone was added (14.3 g, 63 mmol). The mixture was refluxed under argon for 2 days. The reaction mixture was then cooled to room temperature, poured in 700 mL saturated aqueous sodium carbonate solution and stirred at 65° C. for 30 min. The mixture was then cooled to room temperature; the precipitation was filtered and washed with water and dichloromethane.

Yield: 3.3 g (74%).

$^1$H NMR (500 MHz, CD$_2$Cl$_2$) δ (ppm): 9.80 (d, J=8.1, 2H), 8.01-7.63 (m, 11H), 7.61-7.40 (m, 4H).

Fourth Step:

Synthesis of 7-(3-(pyren-1-yl)phenyl)dibenzo[c,h]acridine (11). All manipulations were carried under argon.

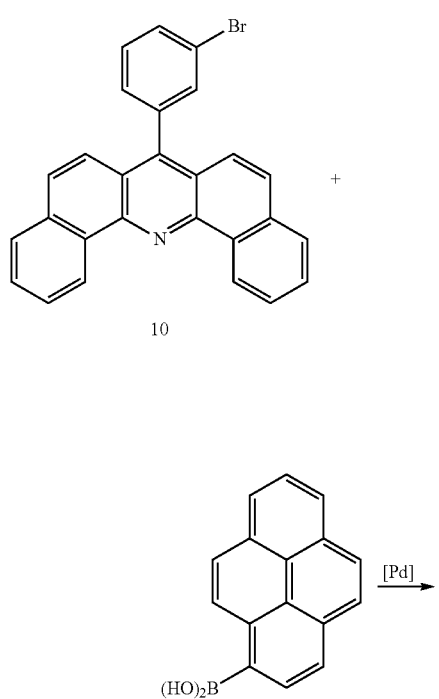

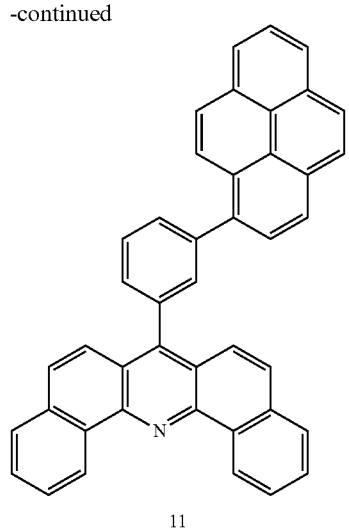

10 (700 mg, 1.61 mmol), pyren-1-ylboronic acid (434 mg, 1.76 mmol), Palladium tetrakis triphenylphoshine (186 mg, 0.16 mmol) and potassium carbonate (1.34 g, 9.66 mmol) were introduced in a flask together with 17 mL toluene, 8.8 mL ethanol and 2.6 mL distilled water. This mixture is stirred at 80° C. during 24 hours before being filtered. The solid is then washed with hexane, water and some mL of chloroform before being dried.

Yield: 392 mg (44%).

Example 4

Synthesis of

Structure 23

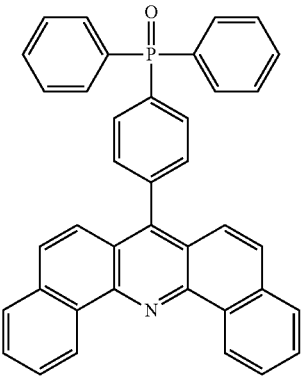

Fourth Step:

Synthesis of (4-(dibenzo[c,h]acridin-7-yl)phenyl)diphenylphosphine oxide (15). All manipulations were carried under argon.

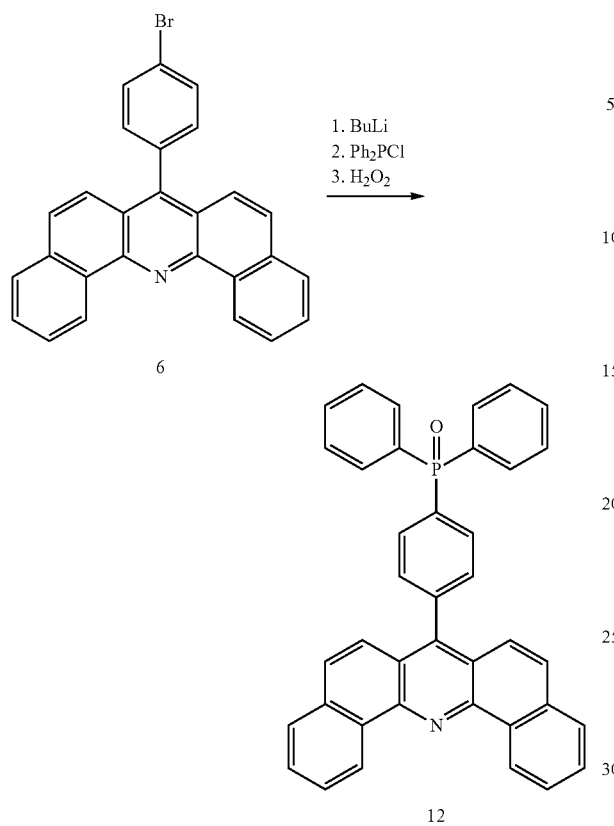

6 (2.84 g, 5.11 mmol) was solved in 40 mL THF. The solution was cooled down to −78° C. and n-BuLi was added drop wise within 20 min (2.5 Mol/L, 3.5 mL, 8.68 mmol), and then stirred at that temperature for 1 hour. The temperature is then let rise up to −50° C., and diphenylphosphine chloride (1.13 g, 5.11 mmol) was added and the mixture was stirred overnight at Room temperature. The reaction was then quenched with Methanol (25 mL), and the solvents were evaporated. The residue was solved in 40 mL dichloromethane and Water peroxide is then added (8 mL $H_2O_2$ aq.) and stirred overnight. The reaction is then washed several times with 50 mL Brine, the organic phase was then dried and evaporated. The crude product is purified via column chromatography ($SiO_2$, Dichloromethane, then DCM/MeOH 97:3). The obtained foamy product is then washed with 200 mL MTBE.

Yield: 1.6 g (43%)
HPLC: >97%
NMR: 31P NMR ($CDCl_3$, 121.5 MHz): δ (ppm): 29 (m).

Example 5

Structure 26

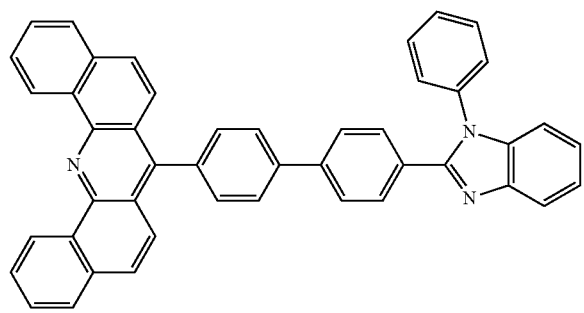

Fourth Step:

Synthesis of 7-(4'-(1-phenyl-1H-benzo[d]imidazol-2-yl)-[1,1'-biphenyl]-4-yl)dibenzo[c,h]acridine (16). All manipulations were carried under argon.

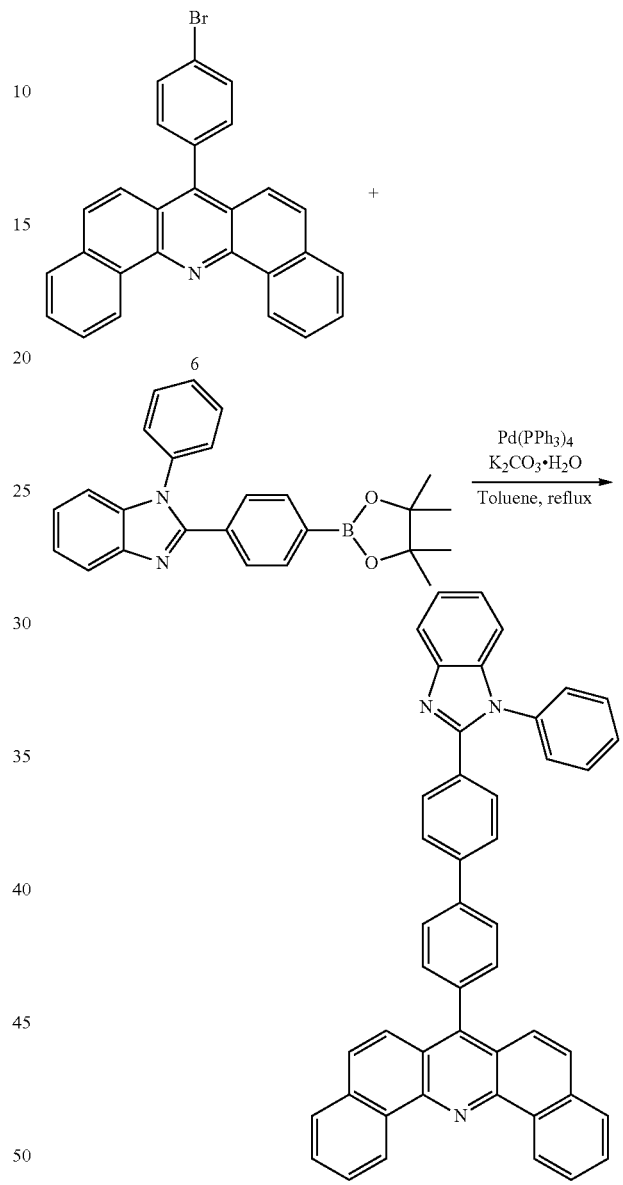

6 (2.1 g, 4.8 mmol), 1-phenyl-2-(4-(4,4,5,5-tetramethyl-1,3,2-dioxaborolan-2-yl)phenyl)-1H-benzo[d]imidazole (3.8 g, 9.6 mmol), Palladium tetrakis triphenylphoshine (830 mg) and 17 mL of a 1M potassium carbonate solution in water were introduced in a flask together with 35 mL degassed toluene. This mixture is stirred at 80° C. during 36 hours before being let cooled to room temperature and filtered. The solid is then dissolved in dichloromethane (600 mL) and filter over a Celite pad. The volatiles are removed by rotary evaporation and the solid is then dried overnight in a vacuum oven.

Yield: 1.2 g (40%)
HPLC>98%.

Example 6

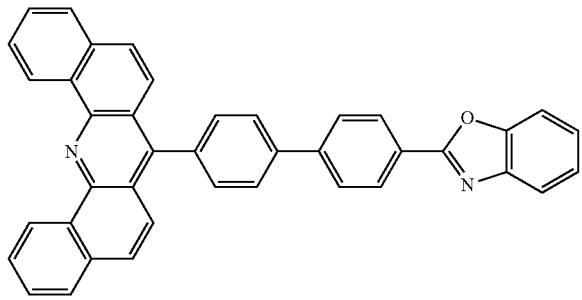
Structure 27

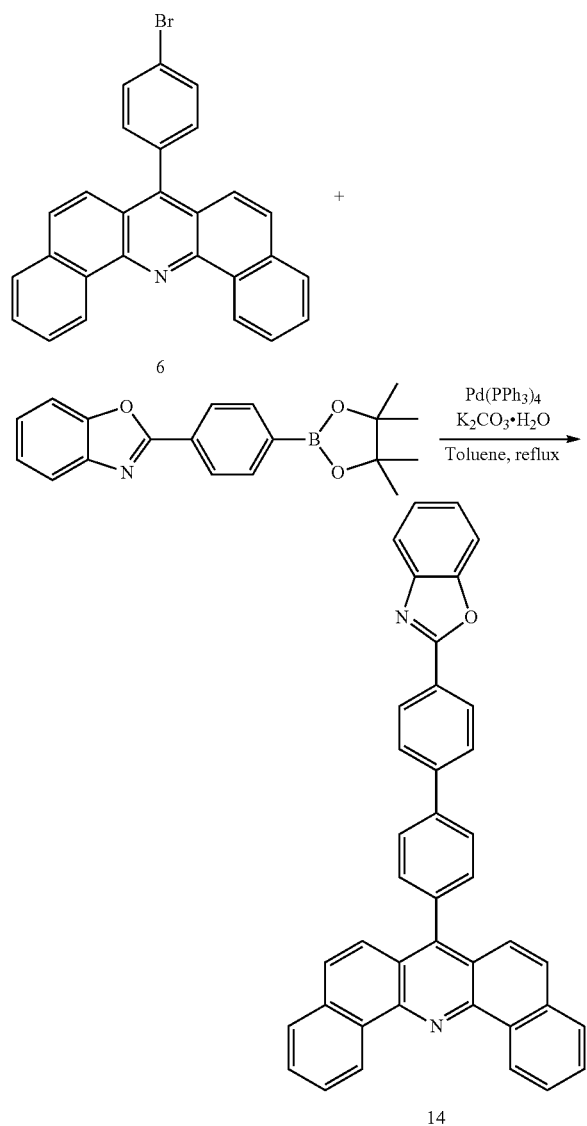

6 (3 g, 6.9 mmol), 1-phenyl-2-(4-(4,4,5,5-tetramethyl-1,3,2-dioxaborolan-2-yl)phenyl)-1H-benzo[d]imidazole (3.3 g, 10.36 mmol), Palladium tetrakis triphenylphoshine (1.2 g) and 30 mL of a 1M potassium carbonate solution in water were introduced in a flask together with 100 mL toluene. This mixture is stirred at 95° C. during 48 hours before being let cooled to room temperature and filtered with a paper filter. The solid is then washed with toluene, and the obtain grey solid is dissolved in 500 ml of hot (150° C.) xylene, this suspension is filtered over a celite pad and the volatiles are then removed by rotary evaporation. The obtained solid is then dried in a vacuum oven. Yield: 2.4 g (65%).

HPLC: >98%

Example 7

Synthesis of

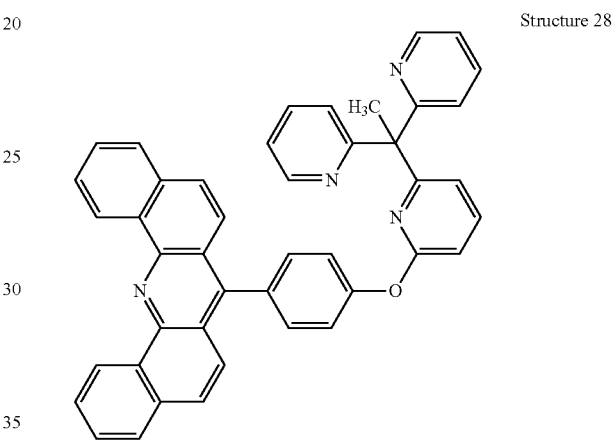
Structure 28

First Step:

Synthesis of (E)-2-(4-methoxybenzylidene)-3,4-dihydronaphthalen-1(2H)-one (15). All manipulations were carried out in air, without any further purification of commercial solvents/chemicals.

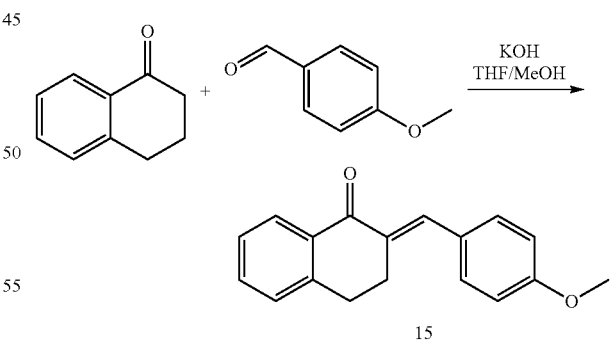
15

A mixture of p-methoxybenzaldehyde (10.00 g, 73.4 mmol, 1.3 eq) and 1-tetralone (8.24 g, 56.4 mmol, 1 eq) was dissolved in tetrahydrofurane (30 mL) and a methanolic solution of potassium hydroxide (4% solution, 250 mL, 7.9 g KOH, 141 mmol, 2.5 eq) was added dropwise over a 15 minutes period to the stirred solution. The mixture was stirred at ambient temperature for three days and the formed precipitate was separated by filtration and purified by washing with MTBE. After drying in vacuo a pale yellow solid (8.57 g, 60% yield, GC-MS purity 99%) was obtained. The filtrate was reduced to a quarter of its volume and a second fraction (3.7 g, 26% yield, GC-MS purity 100%) could be isolated after filtration and washing with a low amount of methanol and a higher amount of MTBE. The over-all yield was 86% and the product was directly used in the next step without any further purification.

Second Step:

Synthesis of 7-(4-methoxyphenyl)-5,6,8,9-tetrahydrodibenzo[c,h]xanthen-14-ium tetra-fluoroborate (16). All manipulations were carried out under argon.

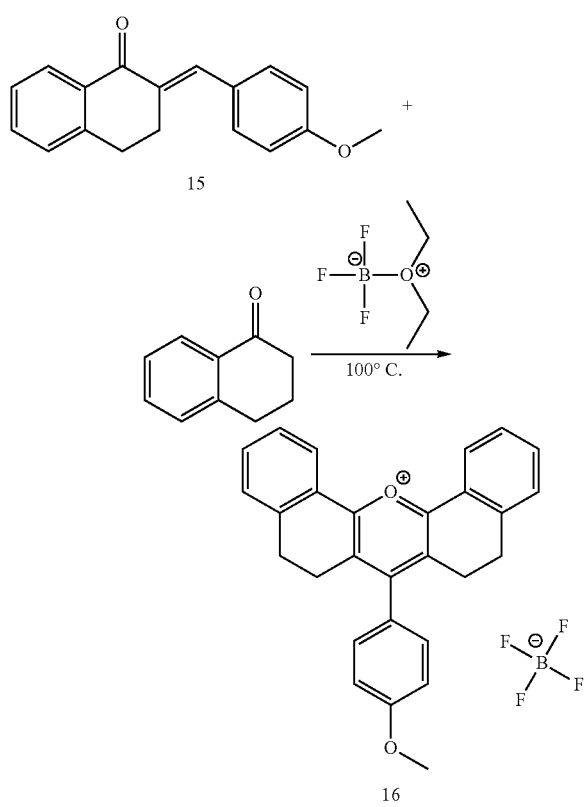

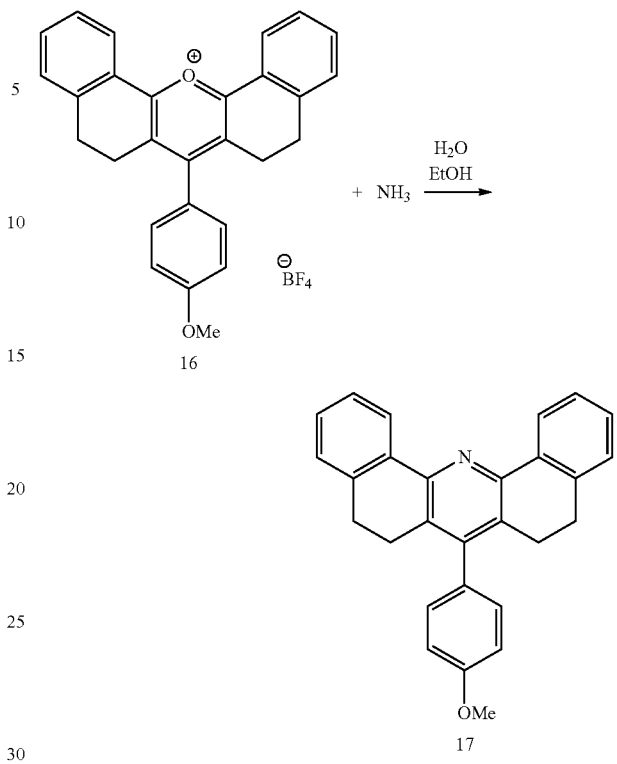

In an inert argon atmosphere (diethyloxonio)trifluoroborate (7.83 g, 7.0 mL, 55.2 mmol, 1.2 eq) was added dropwise to a stirred mixture of (E)-2-(4-methoxybenzylidene)-3,4-dihydronaphthalen-1(2H)-one (15) (12.20 g, 46.2 mmol, 1 eq) and 1-tetralone (6.73 g, 46.0 mmol, 1 eq). After complete addition the mixture was heated at 100° C. for 5½ hours and then cooled to room temperature. Diethylether (50 mL) was added and—after stirring over a 30 minutes period—the product was isolated by filtration and purified by washing with diethylether. After drying in vacuo an ochre solid was obtained. The product was used in the next step without any further purification.

Yield: 6.66 g (30%)

Third Step:

Synthesis of 7-(4-methoxyphenyl)-5,6,8,9-tetrahydrodibenzo[c,h]acridine (17). All manipulations were carried out in air, without any further purification of commercial solvents/chemicals.

16 (6.63 g, 13.9 mmol, 1 eq) was suspended in ethanol (175 mL, denaturated with 1% methylethyl ketone). Under vigorously stirring an ammonia solution (32% aqueous solution, 18.3 g NH$_3$, 1.075 mol, 77 eq) was added dropwise and the mixture was stirred at ambient temperature for 17½ hours to obtain a lavender suspension. The product was isolated by filtration and purified by successive washing with ethanol (250 mL). A lavender solid (91% yield) could be obtained. The compound was directly used in the next step without any further purification.

Yield: 4.93 g (91%)

HPLC: 91% (and 5% of a constitution isomer)

Fourth Step:

Synthesis of 7-(4-methoxyphenyl)dibenzo[c,h]acridine (18). All manipulations were carried out under argon.

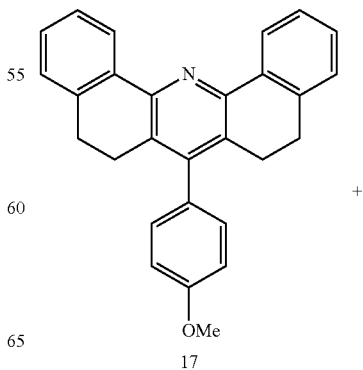

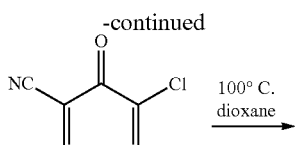

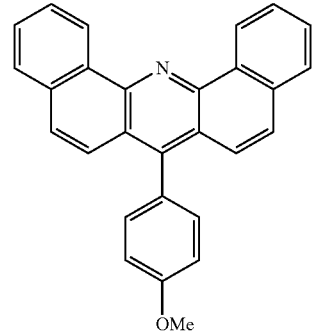

18

In an inert argon atmosphere 17 (4.93 g, 12.7 mmol, 1 eq) was dissolved in abs. 1,4-dioxane (300 mL, dried over sodium) under vigorously stirring at 80° C. 2,3-dichloro-5,6-dicyano-p-benzoquinone (DDQ, 17.25 g, 76 mmol, 6 eq) was added in portions over a 5 minutes period and the DDQ-vessel was flushed with abs. dioxane (20 mL). The almost black mixture was stirred at 80° C. for two days maintaining the inert atmosphere. After cooling to room temperature the reaction mixture was carefully added to 500 mL of an aqueous saturated sodium carbonate solution and the reaction vessel was flushed with saturated $Na_2CO_3$ solution (250 mL) and water (200 mL). After stirring of the mixture at 65° C. for 75 minutes the precipitate was allowed to settle down and the product was isolated by filtration and purified by multiple slurry of the solid in water (overall ca. 1000 mL). After drying of the crude product in vacuo at 40° C. overnight the solid was suspended in methylene chloride (20 mL), stirred for 45 minutes, isolated by filtration and washed with DCM (2×20 mL) and dried overnight. 3.53 g of an ochre solid (72% yield) could be obtained in a 99.5% HPLC purity. Further purification of the material was possible by gradient sublimation (initial amount: 1.00 g, sublimation yield: 67%).

Fifth Step:

Synthesis of 4-(dibenzo[c,h]acridin-7-yl)phenol (19). All manipulations were carried out under argon.

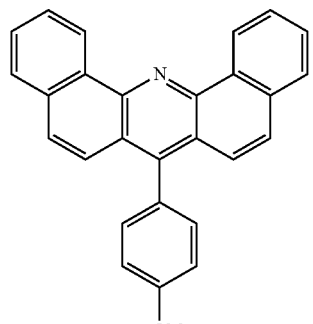 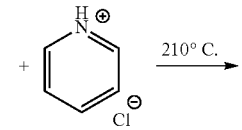

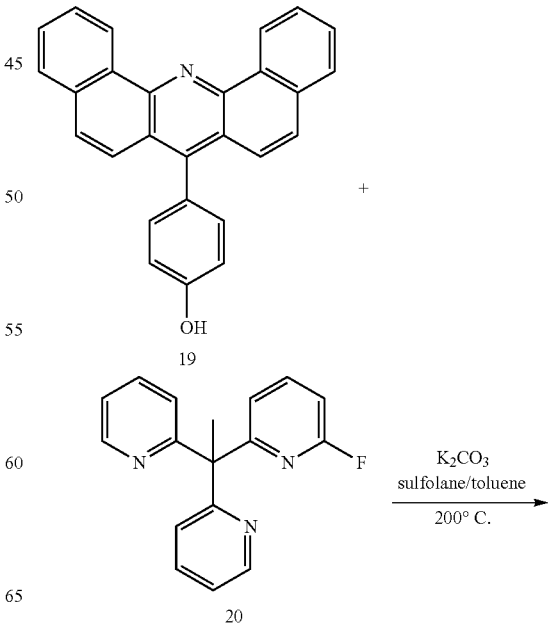

19

In a pressure vessel a mixture of 18 (1.00 g, 2.6 mmol, 1 eq) and pyridiniumhydrochloride (1.75 g, 15.1 mmol, 5.8 eq) was heated to 210° C. under an inert atmosphere and vigorously stirred at this temperature over a three days period. The mixture was allowed to cool down to room temperature. The solidified melt was dissolved in chloroform (50 mL) and water (50 mL) and treated in an ultrasonic bath for 5 minutes. The layers were separated and the aqueous layer was extracted with chloroform (3×50 mL). Afterwards, the combined organic layers were washed with a saturated aqueous sodium hydrogencarbonate solution (5×50 mL) followed by water (3×50 mL) and dried over magnesium sulphate. Evaporation of the solvent at 40° C. led to an old rose coloured solid. The product was directly used in the next step without any further purification.

Yield: 810 mg (84%)

HPLC: 98%

Sixth Step:

Synthesis of 7-(4-((6-(1,1-di(pyridin-2-yl)ethyl)pyridin-2-yl)oxy)phenyl)dibenzo-[c,h]acridine (21). All manipulations were carried out under argon.

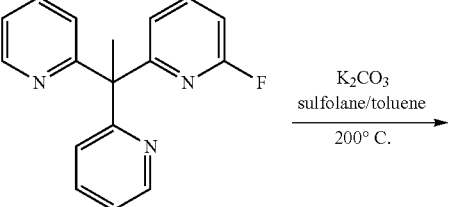

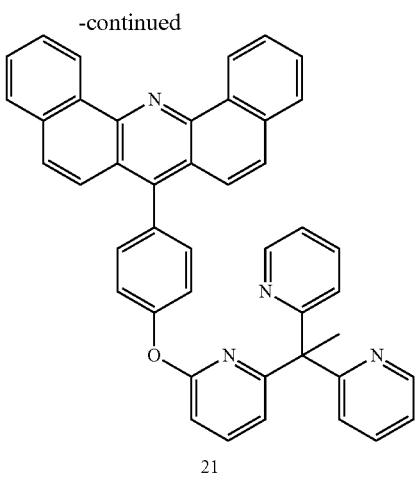

21

In an inert argon atmosphere a mixture of 19 (700 mg, 1.9 mmol, 1 eq), potassium carbonate (1.31 g, 9.5 mmol, 5 eq) and 20 (531 mg, 1.9 mmol, 1 eq) was placed into a pressure vessel. The vessel was sealed and the mixture was heated to 200° C. under vigorously stirring. After five days reaction at this temperature the mixture was allowed to cool down and then poured into ice/water (300 mL). The pressure vessel was flushed with water (2×50 mL) and the solution was extracted with dichloromethane (3×100 mL) until the organic layer remained almost colourless. Afterwards, the combined organic layers were washed with water (3×500 mL) followed by 2 N aqueous hydrogen chloride solution (2×100 mL) and water (300 mL) again. After drying over magnesium sulphate the solvent was removed in vacuo at 40° C. The product was precipitated from the remaining solution by addition of water (1.000 mL), stirring over 10 minutes and isolated by filtration, washing with water (500 mL) and drying overnight at 40° C. in a vacuum dry box. An ochre solid (0.94 g, 78% yield, HPLC purity 99.2%) could be obtained.

Further purification of the material was performed by gradient sublimation (initial amount: 0.93 g, sublimation yield: 43%).

Example of Conductive Layers

The conductivity of a doped layer consisting of material of structure 1 in table 1 doped with 5% of W(hpp)$_4$ (tetrakis(1,3,4,6,7,8-hexahydro-2H-pyrimido[1,2-a]pyrimidinato)ditungsten (II)) was measured at room temperature and was 1.39×10 S/cm.

The conductivity of a doped layer consisting of material of structure 18 in table 1 doped with 5% of W(hpp)$_4$ was measured at room temperature and was 3×10$^{-7}$ S/cm.

The conductivity of a doped layer consisting of material of structure 3 in table 1 doped with 5% of W(hpp)$_4$ was measured at room temperature and was 1.2×10$^{-5}$ S/cm.

The conductivity of a doped layer consisting of material of structure 2 in table 1 doped with 5% of W(hpp)$_4$ was measured at room temperature and was 9.95×10$^{-6}$ S/cm.

Example of an OLED

The compounds from examples 1-3 were successfully employed as electron transport materials in OLEDs. An exemplary device structure is given below.

Device 1

An OLED was fabricated with the following procedure: A glass substrate coated with ITO (90 nm thick, pre-patterned) was cleaned in organic solvents in conventional ultra-sound. Afterwards the substrate was treated with ozone plasma for 5 minutes. After the cleaning, the substrate was transferred to vacuum. The organic layers were deposited in high vacuum (base pressure lower than 10$^{-3}$ Pa) by conventional VTE (Vacuum thermal evaporation). The deposited area was defined by a shadow mask, keeping some area of the ITO surface free so that an electrical contact for the measurements could (later on) be established. The organic layer sequence over the ITO layer is: 50 nm thick NPD layer doped with F4TCNQ; 10 nm thick non-doped NPD layer, 20 nm blue emitter host layer doped with a fluorescent emitter; 10 nm ETL (structure 4), 60 nm ETL (structure 4) doped with W(hpp)$_4$ (5% in weight). A 100 nm aluminum layer was deposited as cathode. The OLED reached 1000 cd/m$^2$ at 3.59 V.

Comparative Example

Using the following material (14-(naphthalen-2-yl)dibenzo[a,j]acridine (structure 1b), Structure 1b

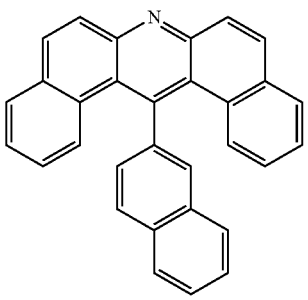

which structure is close to the claimed material as an ETL the following performances were obtained:

Device 2

An OLED was fabricated with the following procedure: A glass substrate coated with ITO (90 nm thick, pre-patterned) was cleaned in organic solvents in conventional ultra-sound. Afterwards the substrate was treated with ozone plasma for 5 minutes. After the cleaning, the substrate was transferred to vacuum. The organic layers were deposited in high vacuum (base pressure lower than 10$^{-3}$ Pa) by conventional VTE (Vacuum thermal evaporation). The deposited area was defined by a shadow mask, keeping some area of the ITO surface free so that an electrical contact for the measurements could (later on) be established. The organic layer sequence over the ITO layer is: 50 nm thick NPD layer doped with F4TCNQ; 10 nm thick non-doped NPD layer, 20 nm blue emitter host layer doped with a fluorescent emitter; 10 nm ETL (structure 1b), 60 nm ETL (structure 1b) doped with W(hpp)$_4$ (5% in weight). A 100 nm aluminum layer was deposited as cathode. The OLED reached 1000 cd/m$^2$ at 4.25 V.

Compounds of structure 1-33 successfully passed sublimation, and device tests, showing a low operating voltage in OLEDs, high power efficiency, and long lifetime.

The features disclosed in the foregoing description and in the claims may, both separately and in any combination thereof, be material for realizing the invention in diverse forms thereof.

The invention claimed is:

1. An electronic device comprising at least one organic semiconducting material according to formula (I):

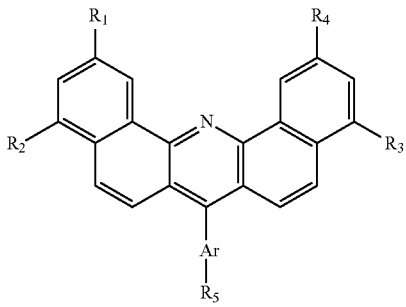

wherein $R_{1-4}$ are independently selected from H, halogen, CN, $C_1$-$C_{20}$-alkyl, $C_1$-$C_{20}$-heteroalkyl, $C_6$-$C_{20}$-aryl, $C_5$-$C_{20}$-heteroaryl, $C_1$-$C_{20}$-alkoxy, or $C_6$-$C_{20}$-aryloxy, wherein each $C_1$-$C_{20}$-alkyl, $C_1$-$C_{20}$-heteroalkyl, $C_6$-$C_{20}$-aryl, $C_5$-$C_{20}$-heteroaryl, $C_1$-$C_{20}$ alkoxy, or $C_6$-$C_{20}$-aryloxy is unsubstituted or substituted, wherein Ar is selected from, substituted or unsubstituted, $C_6$-$C_{20}$-aryl or $C_5$-$C_{20}$-heteroaryl, and $R_5$ is selected from substituted or unsubstituted $C_6$-$C_{20}$-aryl, substituted or unsubstituted $C_5$-$C_{20}$-heteroaryl, H, F, or

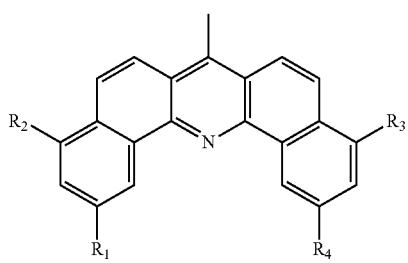

wherein $R_{1-4}$, are as previously defined;

wherein the device has a layered structure and at least one layer comprises at least one compound according to formula (I).

2. The electronic device according to claim 1, wherein Ar and $R_{1-4}$ are independently selected from $C_6$-$C_{20}$ aryl or $C_5$-$C_{20}$-heteroaryl.

3. The electronic device according to claim 1, wherein $R_5$ is H or F, and $R_5$ and Ar are a moiety selected from

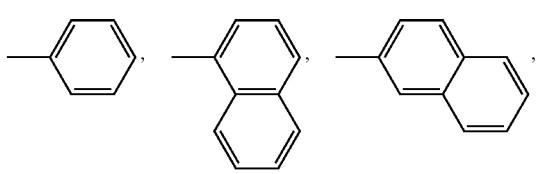

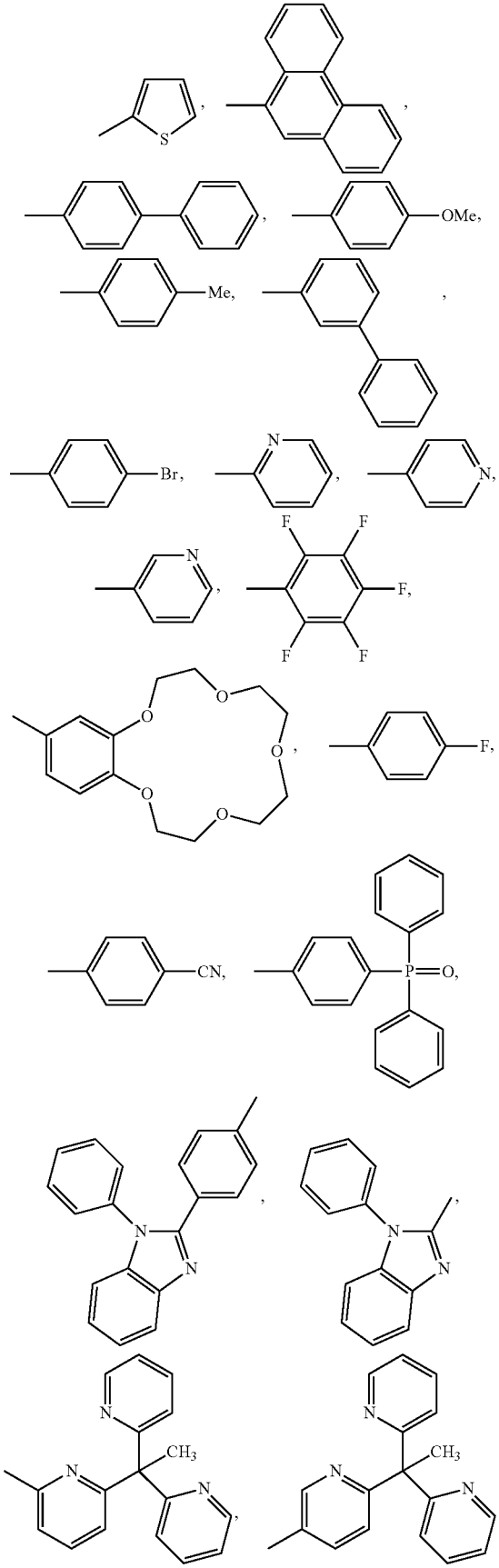

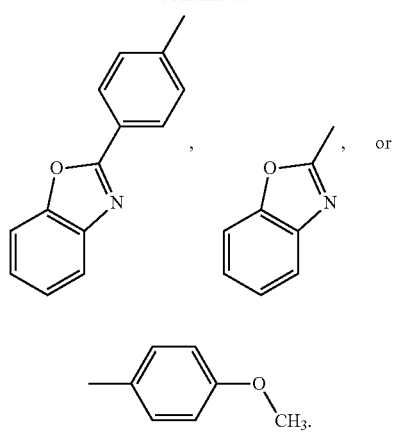, or 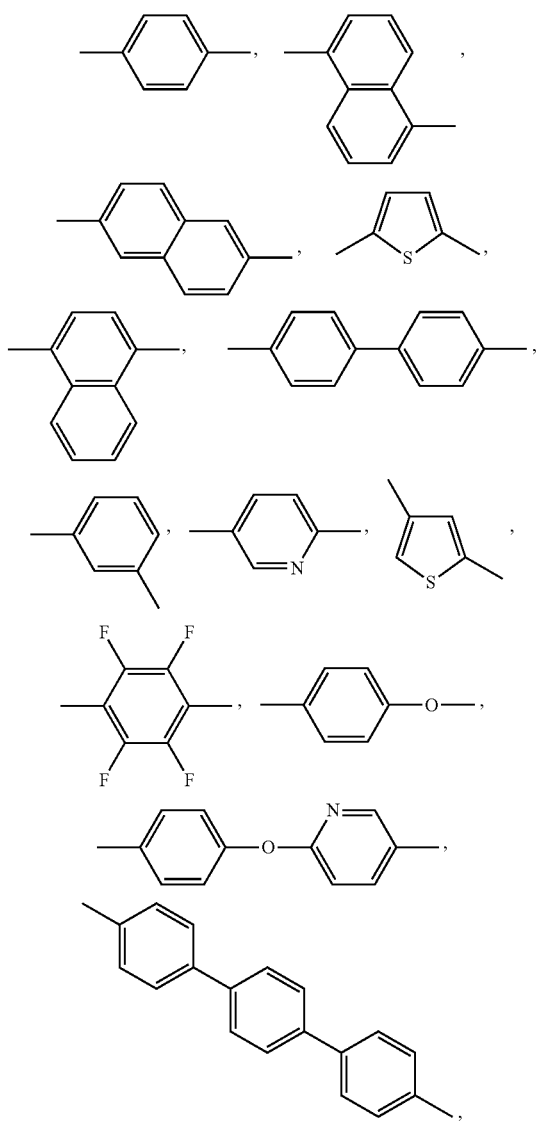
4. The electronic device according to claim 1, wherein Ar is selected from
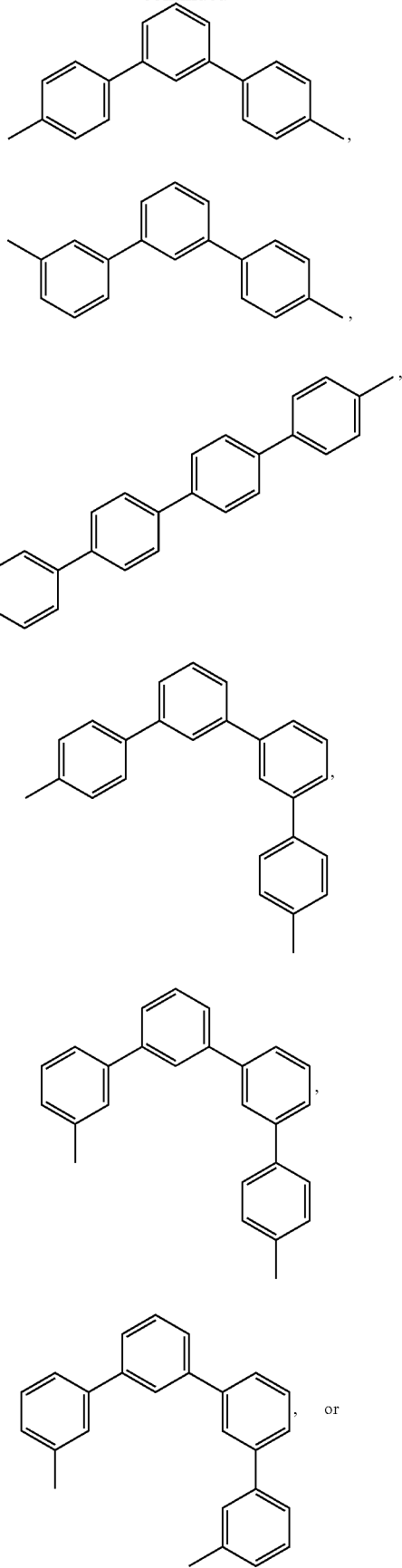

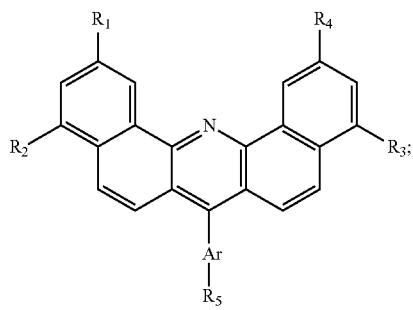

5. The electronic device according to claim 1, wherein the organic semiconducting material is doped by an n-dopant.

6. The electronic device according to claim 5, wherein the organic semiconducting material is doped by an organic n-dopant having a HOMO energy level which is more positive than −3.3 eV.

7. The electronic device according to claim 1, wherein the device is an electronic, optoelectronic or electroluminescent device having an electronically functionally effective region, wherein the electronically effective region comprises at least one compound according to formula (I).

8. The electronic device according to claim 1, wherein the device is an organic light-emitting diode, a field-effect transistor, a sensor, a photodetector, an organic thin-film transistor, an organic integrated circuit, an organic light-emitting transistor, a light-emitting electrochemical cell, or an organic laser diode.

9. A compound according to formula (I):

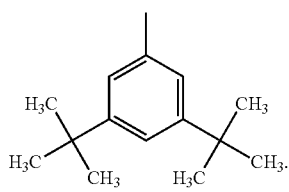

wherein $R_{1-4}$ are independently selected from H, halogen, CN, $C_1$-$C_{20}$-alkyl, $C_1$-$C_{12}$-heteroalkyl, $C_6$-$C_{20}$-aryl, $C_5$-$C_{20}$-heteroaryl, $C_1$-$C_{20}$-alkoxy, or $C_6$-$C_{20}$aryloxy, wherein each $C_1$-$C_{20}$-alkyl, $C_1$-$C_{20}$-heteroalkyl, $C_1$-$C_{20}$-aryl, $C_5$-$C_{20}$-heteroaryl, $C_1$-$C_{20}$-alkoxy, or $C_6$-$C_{20}$-aryloxy is unsubstituted or substituted, wherein $R_5$ is H, and Ar is

* * * * *